(12) United States Patent
Okada

(10) Patent No.: US 7,725,843 B2
(45) Date of Patent: May 25, 2010

(54) BEHAVIORAL SYNTHESIS APPARATUS, BEHAVIORAL SYNTHESIS METHOD, METHOD FOR MANUFACTURING DIGITAL CIRCUIT, BEHAVIORAL SYNTHESIS CONTROL PROGRAM AND COMPUTER-READABLE RECORDING MEDIUM

(75) Inventor: Kazuhisa Okada, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 653 days.

(21) Appl. No.: 11/703,140

(22) Filed: Feb. 7, 2007

(65) Prior Publication Data
US 2007/0214447 A1    Sep. 13, 2007

(30) Foreign Application Priority Data
Feb. 8, 2006    (JP)    ............... 2006-031681

(51) Int. Cl.
*G06F 17/50*    (2006.01)
(52) U.S. Cl. ............................. 716/1; 716/18
(58) Field of Classification Search ......... 716/1–6, 716/18
See application file for complete search history.

(56) References Cited
U.S. PATENT DOCUMENTS
6,493,863 B1 * 12/2002 Hamada et al. ............... 716/18
6,557,157 B1 * 4/2003 Bothel ........................ 716/18
2007/0057714 A1 * 3/2007 Holzle ........................ 327/231

FOREIGN PATENT DOCUMENTS
| | | | |
|---|---|---|---|
| JP | 6-106476 A | 4/1996 | |
| JP | 2002-366596 A | 12/2002 | |
| JP | 2003-67433 A | 3/2003 | |
| JP | 2003-150657 A | 5/2003 | |

\* cited by examiner

*Primary Examiner*—Paul Dinh
(74) *Attorney, Agent, or Firm*—Birch, Stewart, Kolasch & Birch, LLP

(57) ABSTRACT

An A behavioral synthesis apparatus according to the present invention for performing a computer-automated synthesis of a circuit description of a register transfer level from a behavioral description describing a process operation of a circuit, wherein an output of a target computing unit is input to a plurality of subsequent computing units, and in the case when a valid cycle in which a result computed at each of the plurality of subsequent computing units is valid is different from each other, the behavioral synthesis apparatus including: a computing unit fixation section for inserting an input fixation unit between the target computing unit and at least one of the plurality of subsequent computing units, the input fixation unit fixing an input to the at least one subsequent computing unit during cycles other than the valid cycle in which a result computed at the at least one subsequent computing unit is valid.

24 Claims, 16 Drawing Sheets

BEHAVIORAL SYNTHESIS APPARATUS, BEHAVIORAL SYNTHESIS METHOD, METHOD FOR MANUFACTURING DIGITAL CIRCUIT, BEHAVIORAL SYNTHESIS CONTROL PROGRAM AND COMPUTER-READABLE RECORDING MEDIUM

This Nonprovisional application claims priority under 35 U.S.C. §119(a) on Patent Application No. 2006-31681 filed in Japan on Feb. 8, 2006, the entire contents of which are hereby incorporated by reference.

BACKGROUND OF THE INVENTION

1. Field of the Invention

The present invention relates to: a behavioral synthesis apparatus of a computer system for performing a computer-automated synthesis of a circuit description of a register transfer level (RTL) from a behavioral description (design specification of a circuit) having a circuit behavior described therein in order to support designing and manufacturing of a digital circuit; a behavioral synthesis method using the behavioral synthesis apparatus; a method for manufacturing the digital circuit using the behavioral synthesis apparatus; a behavioral synthesis control program for performing the behavioral synthesis method; and a computer-readable recording medium having the behavioral synthesis control program recorded thereon.

2. Description of the Related Art

For example, in designing a large scale integrated circuit (e.g., system LSI), a behavioral synthesis process is performed in order to automatically synthesize hardware of an RTL from a behavioral description of a circuit by using a computer system. This behavioral synthesis is also called a high-level synthesis.

A procedure of this behavioral synthesis process can be broadly classified into: data flow graph generation process; scheduling process; allocation process and the like.

The data flow graph generation process generates a data flow graph based on a behavioral description of a circuit, which only describes behaviors of the circuit but does not describe information regarding a structure of hardware. This data flow graph is also called "CDFG" (Control Data Flow Graph), where a flow of data is represented as a branch and each process (e.g., computation and communication) is represented as a node in a graph.

The scheduling process determines during which execution cycle each process (e.g., computation and communication) in the data flow graph should be executed.

The allocation process allocates a computation process to a circuit element (e.g., computing unit) and also allocates data being currently processed to a register for storage, for example.

Data path and a controller (control circuit) for controlling the data path are generated in accordance with the result of the scheduling process and the allocation process. As a result, hardware which behaves in the same manner as described by the behavioral description is obtained. In general, this obtained hardware is output as a circuit description of a register transfer level (RTL).

In a method for synthesizing hardware from the behavioral description, as one of conventional techniques for reducing power consumption of synthesized hardware, Reference 1 discloses the following. In this conventional technique, a circuit for controlling a clock is synthesized per blocks operating in parallel in hardware. The provision of the clock to the blocks in the circuit is stopped when the blocks are in a wait state in order to lower the power consumption of the hardware.

As another conventional technique for realizing low power consumption, Reference 2 is cited, which discloses "HIGH LEVEL SYNTHESIS METHOD AND APPARATUS". In this conventional technique, a timing of a clock to be input to a register during scheduling is shifted, thereby reducing the number of registers in order to reduce power consumption.

[Reference 1] Japanese Laid-Open Publication No. 2002-366596

[Reference 2] Japanese Laid-Open Publication No. 2003-150657

SUMMARY OF THE INVENTION

As one characteristic of a behavioral synthesis process, computing units are shared and the number of the computing units is reduced, thereby reducing the size of a circuit. In other words, when the same computation process appears several times in a data flow graph, a scheduling process is performed such that these computation processes are executed during different cycles, and an allocation process is performed such that the same computation process executed during the different cycles is executed by one computing unit, thereby reducing the number of the computing units. This computation process will be described in detail in the following.

For example, a data flow graph shown in FIG. 4 represents a computation process of:

$$X = a \times b + c$$

$$y = b \times c - d$$

In FIG. 4, node 101 and node 103 indicate a multiplication process, respectively. Node 102 indicates an addition process. Node 104 indicates a subtraction process. Branches (straight lines) connected to each of the nodes indicate a flow of data.

FIG. 5(a) and FIG. 5(b) show two examples of results obtained after a scheduling process is performed on the data flow graph shown in FIG. 4, respectively.

FIG. 5(a) shows a case in which the nodes 101, 102, 103 and 104 are all executed during cycle 1. FIG. 5(b) shows a case in which the nodes 101 and 102 are executed during cycle 1, and the nodes 103 and 104 are executed during cycle 2.

In the case shown in FIG. 5(a), the computation process is completed in one cycle. However, two multipliers are required since the multiplication 101 and the multiplication 103 are performed during the same cycle. On the other hand, in the case shown in FIG. 5(b), two cycles are required for the computation process. However, the multiplication 101 and the multiplication 103 are performed using one multiplier by shifting a timing of the multiplication 101 and the multiplication 103 which are different from each other since the multiplication 101 and the multiplication 103 are performed during different cycles. Accordingly, a scheduling process is performed so as to have one cycle of computation process as shown in FIG. 5(a) when a circuit operating at a high speed is required, and a scheduling process is performed so as to have two cycles of computation processes as shown in FIG. 5(b) when a circuit occupying only a small amount of area is required.

FIG. 6(a) and FIG. 6(b) show an exemplary circuit structure for executing a result of the scheduling process shown in FIG. 5(a) and FIG. 5(b), respectively.

A circuit shown in FIG. 6(a) includes two multipliers 301 and 303, an adder 302, a subtracter 304 and two registers 305 and 306. Processes at the nodes 101, 102, 103 and 104 shown in FIG. 5(a) are executed by the computing units 301, 302, 303 and 304 shown in FIG. 6(a), respectively, and the results computed by the computing units 301, 302, 303 and 304 are stored in the registers 305 and 306, respectively.

A circuit shown in FIG. 6(b) includes one multiplier 307, an adder 308, a subtracter 309, two registers 310 and 311, a selector 312 and a controller 313. Two multiplication processes at the nodes 101 and 103 in FIG. 5(b) are both executed using the one multiplier 307 by having the two multiplication processes at the nodes 101 and 103 being timed differently from each other. The selector 312 is provided in order to switch inputs to the multiplier 307. In accordance with an enable signal from the controller 313, "a" is selected and output during cycle 1, and "c" is selected and output during cycle 2. An output from the multiplier 307 is input to the registers 310 and 311 via the multiplier 308 and the subtracter 309. The result processed at the multiplier 308 is stored in the register 310 at the completion of cycle 1 in accordance with an enable signal from the controller 313. The result processed at the substracter 309 is stored in the register 311 at the completion of cycle 2 in accordance with an enable signal from the controller 313.

However, in such a circuit in which a computing unit is shared (in FIG. 6(b), this computing unit is the multiplier 307), there is a concern that wasteful power consumption occurs. In other words, the result processed at the multiplier 308 is stored in the register 310 during cycle 1. However, at the same time, an input of the substracter 309 is changed, and thus a signal inside the substracter 309 is changed. When the signal inside the substracter 309 is changed, current (e.g., gate charging/discharging current) of a MOS transistor which makes up the substracter 309 flows, resulting in power consumption, for example. However, since the result computed at the substracter 309 is not stored in the register 311 during cycle 1, power consumed in the substracter 309 is wasted. Similarly, during cycle 2, power is wastefully consumed at the adder 308.

In the following description, a computing unit which lastly processes data to be stored in a register is active, and computing units other than that are inactive. For example, during cycle 1, the multiplier 307 and the adder 308 are active, and the subtracter 309 is inactive.

Wasteful power consumption is an inherent problem caused by sharing a computing unit in a behavioral synthesis process. Accordingly, even if a clock is controlled by using conventional techniques respectively disclosed in Reference 1 and Reference 2, it is impossible to prevent this problem. The reason for this is that it is not possible to stop a clock because a required computation process is executed at an active computing unit. As a side effect resulting from this computation process, wasteful power consumption occurs at an inactive computing unit.

The present invention is intended to solve the conventional problems described above. The objective of the present invention is to provide: a behavioral synthesis apparatus capable of achieving the objective of the present invention of preventing an occurrence of wasteful power consumption caused due to the sharing of one computation unit in a behavioral synthesis process in order to easily and assuringly achieve lower power consumption of hardware; a behavioral synthesis method using the behavioral synthesis apparatus; a method for manufacturing the digital circuit using the behavioral synthesis apparatus; a behavioral synthesis control program for performing the behavioral synthesis method; and a computer-readable recording medium having the behavioral synthesis control program recorded thereon.

A behavioral synthesis apparatus according to the present invention is provided for performing a computer-automated synthesis of a circuit description of a register transfer level from a behavioral description describing a process operation of a circuit, wherein an output of a target computing unit is input to a plurality of subsequent computing units, and in the case when a valid cycle in which a result computed at each of the plurality of subsequent computing units is valid is different from each other, the behavioral synthesis apparatus including: a computing unit fixation section for inserting an input fixation unit between the target computing unit and at least one of the plurality of subsequent computing units, the input fixation unit fixing an input to the at least one subsequent computing unit during cycles other than the valid cycle in which a result computed at the at least one subsequent computing unit is valid, thereby the objective described above being achieved.

Preferably, a behavioral synthesis apparatus according to the present invention further includes: control data flow graph generation section for automatically generating a control data flow graph from the behavior description, the control data flow graph representing a flow of data as a branch and each computation process or communication process as a node in a graph; scheduling section for determining during which execution cycle a process at each node in the control data flow graph should be executed; allocation section for allocating the computation process to a circuit element of a computing unit and at the same time allocating data being currently processed to a register for storage; and data path/controller generation section for automatically generating a data path and a controller for controlling the data path in accordance with each result processed by the scheduling section and the allocation section, and for creating a net list representing a connection relationship among the data path, the controller, the computing unit and the register, and the computing unit input fixation section inserts the input fixation unit between the target computing unit allocated with a plurality of computation processes by the allocation section and a subsequent computing unit at an output of the target computing unit in the net list obtained by the data path/controller generation section.

Still preferably, the computing unit input fixation section in a behavioral synthesis apparatus according to the present invention includes: target computing unit searching section for making reference to the result processed by the allocation section and searching the target computing unit allocated by the allocation section; subsequent computing unit searching section for searching a subsequent computing unit, to which an output from the target computing unit is input; and input fixation unit insertion section for inserting the input fixation unit between the target computing unit and the subsequent computing unit.

Still preferably, in the input fixation unit in a behavioral synthesis apparatus according to the present invention, in accordance with a control signal from the controller, an output from the target computing unit is input, without change, to the subsequent computing unit during a valid cycle when the subsequent computing unit is active, and an input to the subsequent computing unit is fixed to a constant value during cycles other than the valid cycle regardless of a state of the output from the target computing unit.

Still preferably, the input fixation unit in a behavioral synthesis apparatus according to the present invention is a latch circuit.

Still preferably, the input fixation unit in a behavioral synthesis apparatus according to the present invention includes a plurality of AND gates controlled by a control signal from the controller.

Still preferably, the subsequent computing unit in a behavioral synthesis apparatus according to the present invention is a multiplier, an adder or a subtracter.

Still preferably, the input fixation unit in a behavioral synthesis apparatus according to the present invention outputs an input without change during the valid cycle and outputs bits only having "0" during cycles other than the valid cycle.

Still preferably, the subsequent computing unit in a behavioral synthesis apparatus according to the present invention outputs bits only having "0" when all the bits being "0" are input to one of inputs of the subsequent computing unit.

Still preferably, the subsequent computing unit in a behavioral synthesis apparatus according to the present invention is a bit OR computing unit, the input fixation unit includes a plurality of OR gates controlled by a control signal from the controller.

Still preferably, the input fixation unit in a behavioral synthesis apparatus according to the present invention outputs an input without change during the valid cycle and outputs bits only having "1" during cycles other than the valid cycle.

Still preferably, the subsequent computing unit in a behavioral synthesis apparatus according to the present invention outputs bits only having "1" when all the bits being "1" are input to one of inputs of the subsequent computing unit.

Still preferably, a behavioral synthesis apparatus according to the present invention further includes an input fixation necessity determining section for comparing a value of estimated power consumption when the input fixation unit is inserted between the computing units and a value of estimated power consumption when no input fixation unit is inserted between the computing units and for initiating the computing unit fixation section and inserting the input fixation unit between the computing units only when the former is smaller than the latter.

A behavioral synthesis method using a behavioral synthesis apparatus is provided for performing a computer-automated synthesis of a circuit description of a register transfer level from a behavioral description describing a process operation of a circuit, wherein an output of a target computing unit is input to a plurality of subsequent computing units, and in the case when a valid cycle in which a result computed at each of the plurality of subsequent computing units is valid is different from each other, the behavioral synthesis method including: a computing unit fixation step for inserting an input fixation unit between the target computing unit and at least one of the plurality of subsequent computing units, the input fixation unit fixing an input to the at least one subsequent computing unit during cycles other than the valid cycle in which a result computed at the at least one subsequent computing unit is valid, thereby the objective described above being achieved.

Preferably, a behavioral synthesis method according to the present invention further includes: control data flow graph generation step for automatically generating a control data flow graph from the behavior description, the control data flow graph representing a flow of data as a branch and each computation process or communication process as a node in a graph; scheduling step for determining during which execution cycle a process at each node in the control data flow graph should be executed; allocation step for allocating the computation process to a circuit element of a computing unit and at the same time allocating data being currently processed to a register for storage; and data path/controller generation step for automatically generating a data path and a controller for controlling the data path in accordance with each result processed by the scheduling step and the allocation step, and for creating a net list representing a connection relationship a connection relationship among the data path, the controller, the computing unit and the register, and the computing unit input fixation step inserts the input fixation unit between the target computing unit allocated with a plurality of computation processes by the allocation step and a subsequent computing unit at an output of the target computing unit in the net list obtained by the data path/controller generation step.

Still preferably, the computing unit input fixation step in a behavioral synthesis method according to the present invention includes: target computing unit searching step for making reference to the result processed by the allocation step and searching the target computing unit allocated by the allocation step; subsequent computing unit searching step for searching a subsequent computing unit, to which an output from the target computing unit is input; and input fixation unit insertion step for inserting the input fixation unit between the target computing unit and the subsequent computing unit.

Still preferably, a behavioral synthesis method according to the present invention further includes an input fixation necessity determining step for comparing a value of estimated power consumption when the input fixation unit is inserted between the computing units and a value of estimated power consumption when no input fixation unit is inserted between the computing units and for initiating the computing unit fixation step and inserting the input fixation unit between the computing units only when the former is smaller than the latter.

Still preferably, in the input fixation unit in a behavioral synthesis method according to the present invention, in accordance with a control signal from the controller, an output from the target computing unit is input, without change, to the subsequent computing unit during a valid cycle when the subsequent computing unit is active, and an input to the subsequent computing unit is fixed to a constant value during cycles other than the valid cycle regardless of a state of the output from the target computing unit.

A digital circuit manufacturing method according to the present invention, using a behavioral synthesis method according to the present invention described above for designing a digital circuit, is provided for manufacturing the designed digital circuit, thereby the objective described above being achieved.

A behavioral synthesis control program according to the present invention is provided for causing a computer to perform each step of a behavioral synthesis method according to the present invention described above, thereby the objective described above being achieved.

A computer-readable recording medium according to the present invention having a behavioral synthesis control program according to the present invention described above recorded thereon is provided, thereby the objective described above being achieved.

Hereinafter, functions of the present invention owing the structure described above will be described.

According to the present invention, in a behavior synthesis for generating an RTL description from a behavior description, when a computing unit is shared by a plurality of computation processes, an input fixation unit is inserted between a computing unit and at least one its subsequent computing unit, the input fixation unit fixing input to the subsequent computing unit during cycles (the subsequent computing unit is inactive) other than a valid cycle at which a result to be computed at the subsequent computing unit is valid (the subsequent computing unit is active).

In the case when the subsequent computing unit is inactive, even if an output of the target computing unit is changed, it is possible to suppress power consumption wasted by the subsequent computing unit since input to the subsequent computing unit is fixed by the input fixation unit and thus does not change.

In order to suppress an increase of power consumed at an input fixation unit, a comparison is performed between a value of estimated power consumption when an input fixation unit is inserted between computing units and a value of estimated power consumption when no input fixation unit is inserted between the computing units, as described above. Only when the former value is smaller than the latter value, the input fixation unit can be inserted.

As described above, according to the present invention, in the case of generating a circuit in which one computing unit is shared by a plurality of computation processes, by inserting an input fixation unit for fixing input to its subsequent computing unit when the subsequent computing unit is inactive between the computing unit and the subsequent computing unit, it is possible to suppress wasteful power consumption by the subsequent computing unit prevented, thereby realizing low power consumption of hardware.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of a computer system using a behavioral synthesis apparatus according to the present invention and a behavioral synthesis method using this behavioral synthesis apparatus will be described in detail with reference to the accompanying figures.

Figure 1:
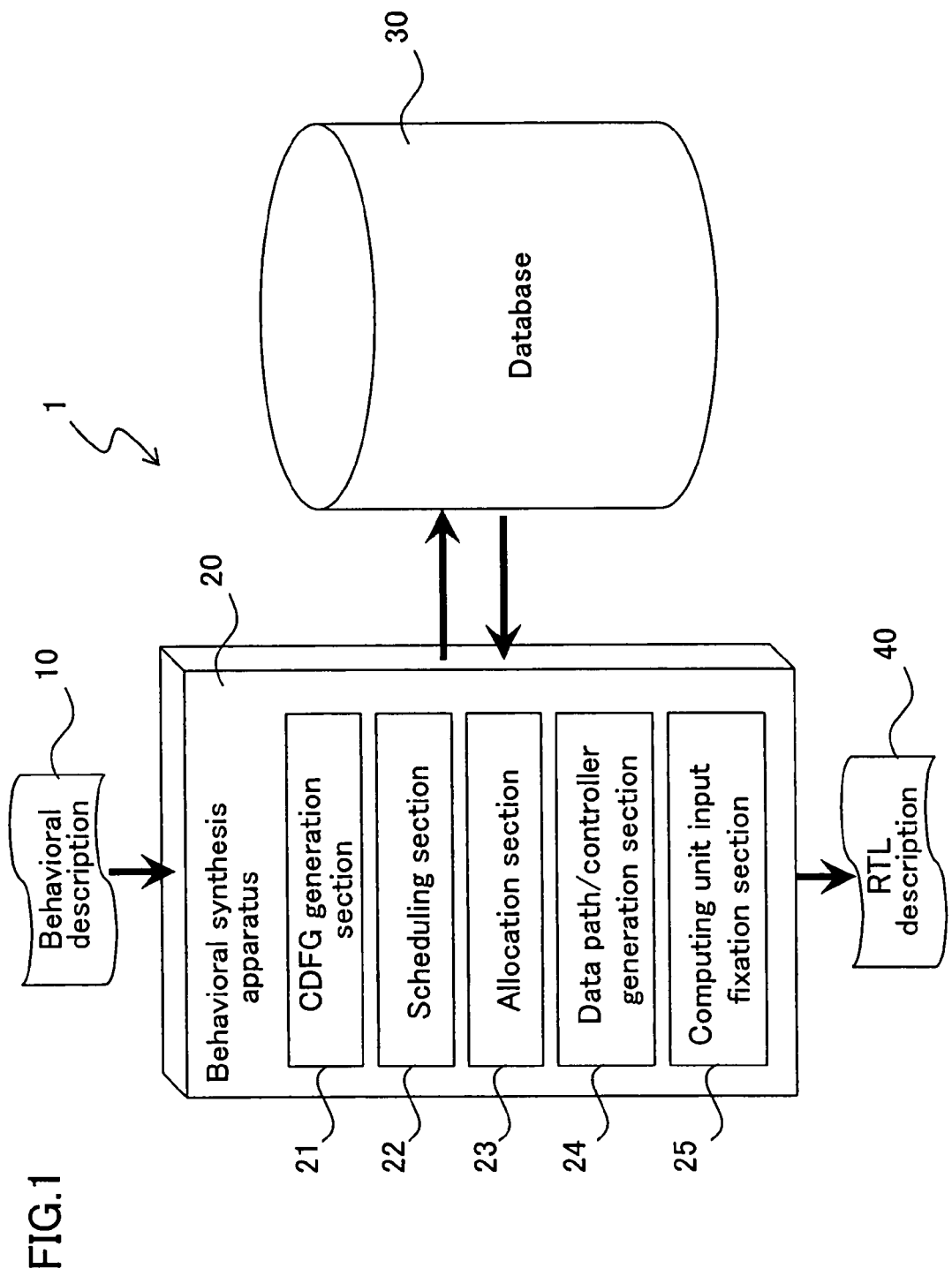
FIG. 1 is a block diagram showing an essential exemplary structure of a computer system according to an embodiment of the present invention.

FIG. 1 is a block diagram showing an essential exemplary structure of a computer system according to an embodiment of the present invention.

In FIG. 1, a computer system 1 includes: a behavioral description storage unit for storing behavioral description 10 or an external input unit to which the behavior description 10 is externally input; a behavioral synthesis apparatus 20 for performing a behavioral synthesis process in order to automatically generate an RTL description 40 from the behavioral description 10; a database 30 for holding data required by the behavioral synthesis apparatus 20 for the behavioral synthesis process; and an RTL description storage unit for storing the RTL description 40 from the behavioral synthesis apparatus 20 or an external output unit capable of directly outputting the RTL description from the behavioral synthesis apparatus 20 to the outside.

The behavioral synthesis apparatus 20 includes: control data flow graph (CDFG) generation section 21; scheduling section 22; allocation section 23; data path/controller generation section 24; and a computing unit input fixation section 25. In the behavioral synthesis process in order to automatically generate the RTL description 40 from the behavior description 10 by a computer, when a computing unit is shared by a plurality of computation processes, an input fixation unit is inserted by the unit input fixation section 25 between this computing unit described above and at least one its subsequent computing unit, which will be described later in detail as a characteristic structure of the present invention. The input fixation unit fixes input to the subsequent computing unit during cycles (the subsequent computing unit is inactive) other than a valid cycle at which a result to be computed at the subsequent computing unit is valid (the subsequent computing unit is active). As a result, in the case when the subsequent computing unit is inactive, even if an output of the target computing unit is changed, it is possible to suppress power consumption wasted by the subsequent computing unit since input to the subsequent computing unit is fixed by the input fixation unit and thus does not change.

In this behavioral synthesis apparatus 20, the behavior description 10, which only describes behaviors of a circuit but does not describe information regarding a structure of hardware, is input and a behavioral synthesis process is performed. The RTL description 40 is output as a result of the behavioral synthesis process. A CDFG, which is generated by the behavioral synthesis apparatus 20 as an interim data during the behavioral synthesis process; a scheduling result; an allocation result; data path/controller structural information and the like each are stored in the database 30 and are made reference to as necessary.

Herein, a hardware structure of the behavioral synthesis apparatus 20 will be described.

Figure 2:
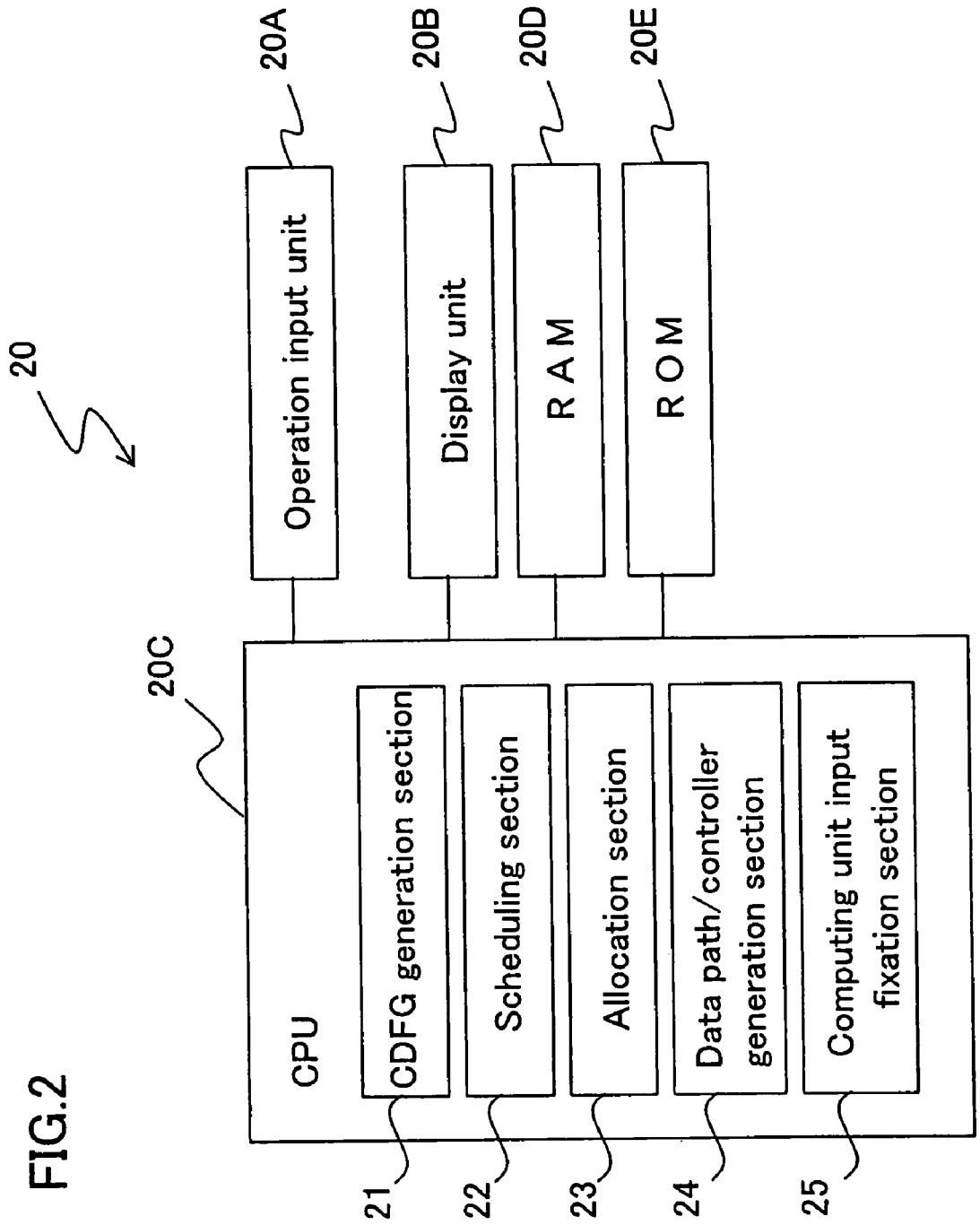
FIG. 2 is a block diagram showing a hardware structure of a behavioral synthesis apparatus shown in FIG. 1.

As shown in FIG. 2, the behavioral synthesis apparatus 20 includes: an operation input unit 20A (e.g., keyboard, mouse, screen input device) capable of issuing a variety of input orders; a display unit 20B capable of displaying on a display screen a variety of images (e.g., initial screen, selection guidance screen and process result screen) according to the variety of input orders; a CPU 20C (Central Processing Unit) as control section for controlling the entire behavioral synthesis apparatus 20; an RAM 20D as a temporary storage section serving as a work memory when the CPU is initiated; and a ROM 20E as a computer-readable recording medium (storage section) having a behavioral synthesis control program for operating the CPU 20C and a variety of data and the like recorded thereon, which are used for the behavioral synthesis control program.

The CPU 20C executes each of the functions of: CDFG generation section 21 for generating a control data flow graph (CDFG), which represents in a graph a flow of data as a branch and each process of computation and communication as a node, from a behavior description of a circuit, based on the behavioral synthesis control program and the variety of data used for this which have been read into the RAM 20D from the ROM 20E; scheduling section 22 for determining during which execution cycle a process at each node in the CDFG should be executed; an allocation section 23 for allocating a computation process to a circuit element and at the same time allocating data being currently processed to a register for storage; data path/controller generation section 24 for generating a data path and a controller for controlling the data path in accordance with each result processed by the scheduling section 22 and the allocation section 23, and for creating a net list representing a connection relationship among the data path, the controller, computing units and registers; and a computing unit input fixation section 25 for inserting an input fixation unit between one of a plurality of computing units, which is allocated with a plurality of computation processes by the allocation section 23, and its subsequent computing unit at an output of the computing unit in the net list obtained by the data path/controller generation section 24, the input fixation unit fixing an input to the subsequent computing unit during cycles other than a valid cycle at which a result to be computed at the subsequent computing unit is valid.

The ROM 20E may be provided within the database 30. However, in this case, the ROM 20E is provided within in the behavioral synthesis apparatus 20 and structured with a computer-readable medium (storage section) (e.g., hard disk, optical disk, magnetic disk and IC memory). The behavioral synthesis control program and the variety of data used for the behavioral synthesis control program may be downloaded onto the ROM 20E from a portable optical disk, magnetic disk, IC memory and the like. Alternatively, they may be downloaded onto the ROM 20E from a hard disk of a computer. Still alternatively, they may be downloaded onto the ROM 20E in a wired or wireless manner or via the Internet.

Hereinafter, an operation of the behavioral synthesis process according to the present invention owing to the structure described above will be described in detail.

Figure 3:
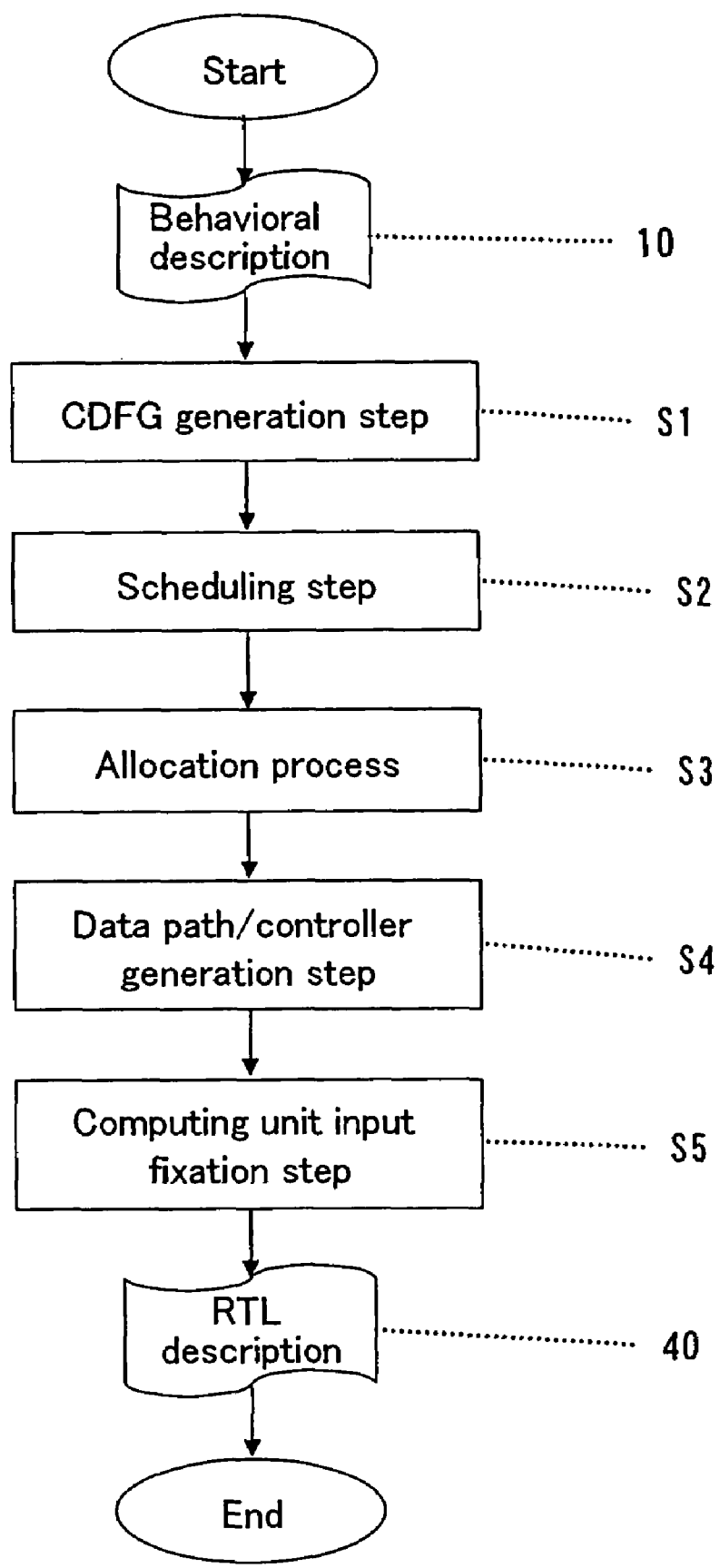
FIG. 3 is a flowchart showing a procedure of the behavioral synthesis process by the behavioral synthesis apparatus shown in FIG. 1.

FIG. 3 is a flowchart showing a procedure of the behavioral synthesis process by the behavioral synthesis apparatus 20 shown in FIG. 1.

As shown in FIG. 3, in a CDFG generation step in step S1, the behavioral description 10 for a circuit, which only describes behaviors of the circuit but does not describe information regarding a structure of hardware, is input to the behavioral synthesis apparatus 20, and then CDFG is automatically generated based on the input behavioral description 10 where a flow of data is represented as a branch and each process of computation and communication is represented as a node in a graph. This generated CDFG is registered in the database 36 as a set of branch/node information.

Figure 4:
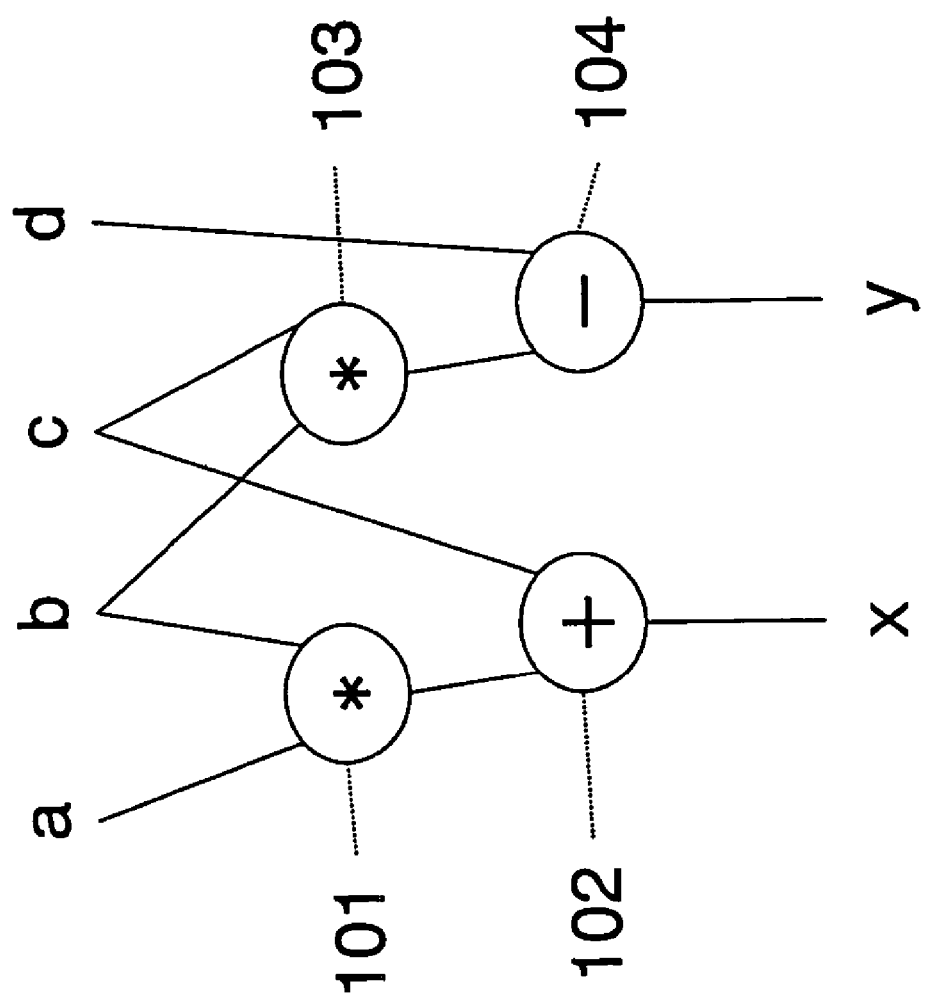
FIG. 4 is a diagram showing an exemplary CDFG.

This branch/node information includes a node number, a type of computation process, a node number of a branch for its connection and the like. One node in the CDFG is represented as one piece node of information, and the entire CDFG is represented as an array or list of the node information. In an actual design process of the computer system 1, in the case of a large scale digital circuit, a CDFG generation process is performed on a calculator since the number of nodes in the CDFG sometimes exceeds 10,000. The scheduling process and processes subsequent thereto are performed in a similar manner. In this case, the CDFG is numeric value data on the database 30. However, for the sake of convenience for explanation, hereinafter, this numeric value data is represented in the graph shown in FIG. 4.

Next, in a scheduling step in step S2, it is determined during which execution cycle each node (each process of computation and communication) in the CDFG should be executed. Information of the determined execution cycle is added to the branch/node information of each node on the database 30. The method for determining the execution cycle is not particularly limited to any one method. However, any method may be applied for determining the execution cycle. The result which is obtained after the scheduling process is performed on the CDFG shown in FIG. 3 is shown, for example, in FIG. 5(b) as an example in which a computing unit is shared by a plurality of computations, which has been described above.

Figure 6:
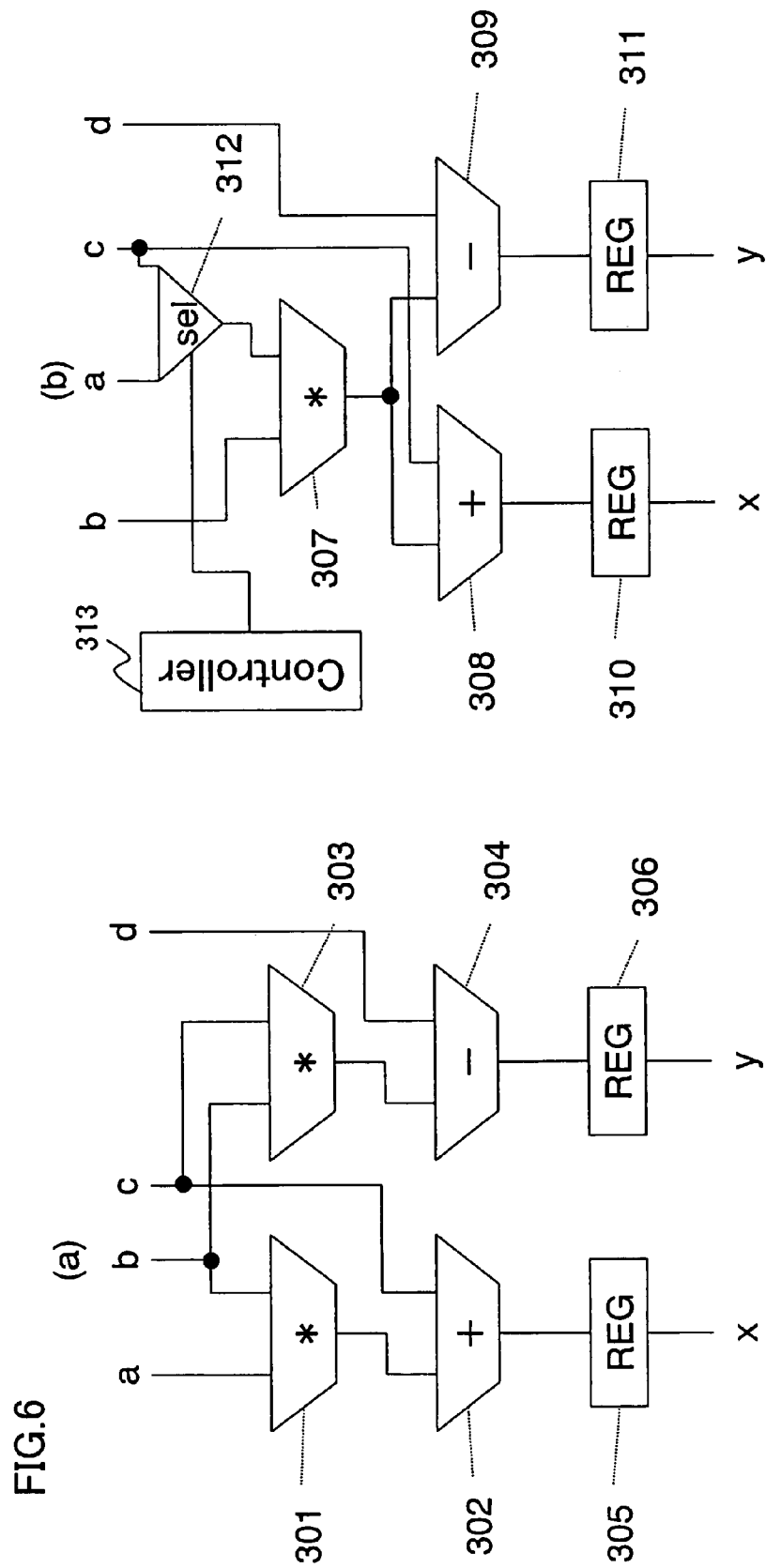
FIGS. 6(a) and (b) show an exemplary circuit structure for executing a result of the scheduling process shown in FIGS. 5(a) and 5(b), respectively.

Further, as shown in FIG. 6(b), in an allocation step in step S3, a process for allocating a process at each node in the CDFG to a computing unit and a process for allocating data currently being processed to the register for storage are performed. Information of the allocated computing unit/register is added to the node information of each node on the database 30. The method for allocating the computing unit/register is not particularly limited to any one method. However, any method may be applied for allocating the computing unit/register. It should be noted herein that there is a possibility that the same computation which is performed during a plurality of different cycles may be allocated to one computing unit. This allocation step may be performed prior to the scheduling step, depending on a method of behavioral synthesis process.

Thereafter, in a data path/controller generation step in step S4, the data path (selector 312) and the controller 313 for controlling the data path (selector 312) are generated as shown in FIG. 6(b), in accordance with the result of the scheduling step and the result of the allocation step. Information of the generated data path (selector 312) and the controller 313 is registered to the database 30 as a net list representing a connection relationship among computing units, registers, the data path and the controller.

Further, in a computing unit input fixation step in step S5, for the computing unit allocated with a plurality of computations in the allocation step, an input fixation unit is inserted between this target computing unit and each of its subsequent computing units at the output of target computing unit in the net list, which is obtained as a result of the data path generation process. The input fixation unit passes data to the subsequent computing unit at a cycle only when a process at the subsequent computing unit is valid (the subsequent computing unit is active) and otherwise fixes an input to the subsequent computing unit (the subsequent computing unit is inactive) a constant value.

Figure 5:
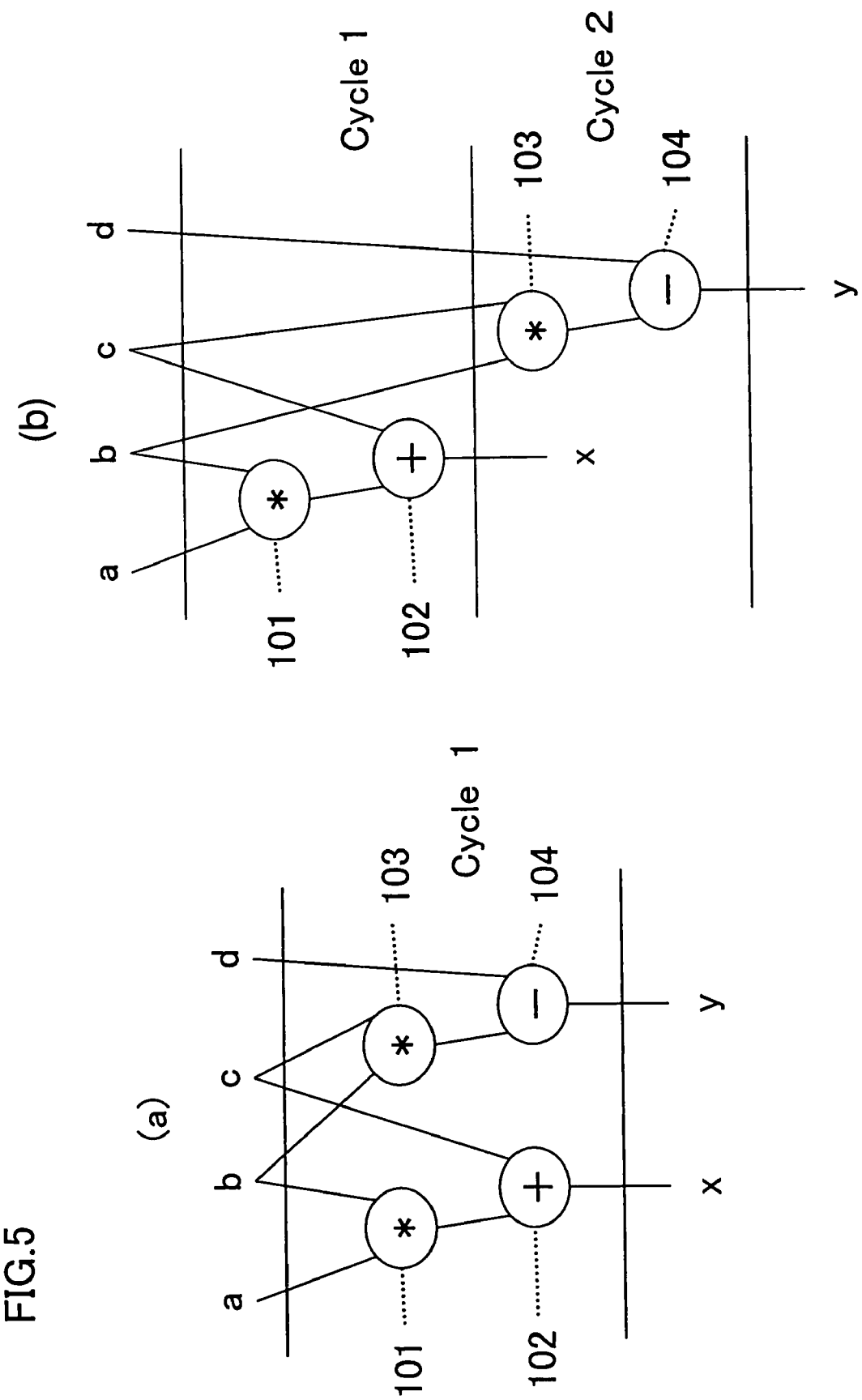
FIGS. 5(a) and (b) show two examples of results obtained after a scheduling process is performed on the CDFG shown in FIG. 4, respectively.

For example, when the scheduling process is performed as shown in FIG. 5(b), and the nodes 101 and 103 are allocated with one multiplier 307 in the allocation step as shown in FIG. 6(b), the data path (selector 312) is automatically generated.

Herein, the result on the database 30, which is obtained by the process of the allocation section 23, is made reference to, and then the one computing unit (multiplier) 307, for a plurality of computation processes allocated with the plurality of computation processes by the allocation section 23 in the data flow graph, is searched. Accordingly, it is recognized that the multiplier 307 in FIG. 6(b) is targeted for the computing unit input fixation step.

Figure 7:
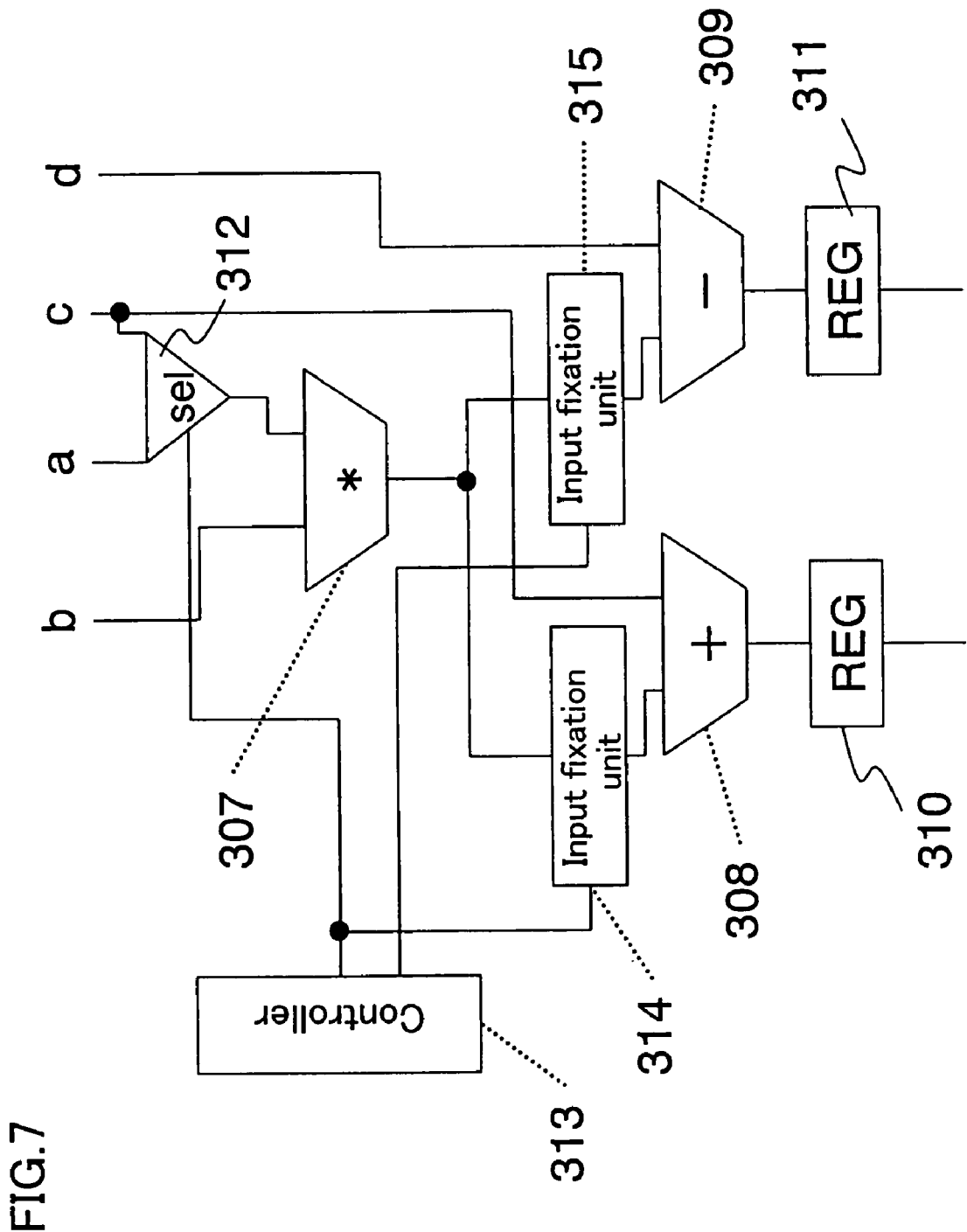
FIG. 7 is a diagram showing an exemplary circuit having an input fixation unit inserted in the circuit shown in FIG. 6(b).

In FIG. 6(b), an output from the multiplier 307 allocated with the plurality of computation processes is input to both the adder 308 and the subtracter 309. Subsequent computing units (adder 308 and subtracter 309) for input from the output of the computing unit 307 are searched. Accordingly, input fixation units 314 and 315 are input between the multiplier 307 and the adder 308 and between the multiplier 307 and the subtracter 309, respectively, as shown in FIG. 7.

As described above, a computing unit input fixation step in step S5 includes a target computing unit searching step; a subsequent computing unit searching step; and an input fixation unit insertion step.

In accordance with a cycle signal from the controller 313, the input fixation unit 314 inputs an output from the multiplier 307 to the adder 308 during cycle 1 when the adder 308 is active and otherwise fixes an input to the adder 308 to a constant value. As a result, even when an output of the multiplier 307 is changed during cycle 2, the input to the adder 308 does not change, thereby preventing power from being wastefully consumed at the adder 308.

In a similar manner, the input fixation unit 315 inputs an output from the multiplier 307 to the substracter 309 during cycle 2 when the substracter 309 is active and otherwise fixes an input to the substracter 309 to a constant value. As a result, even when an output of the multiplier 307 is changed during cycle 1, the input to the substracter 309 does not change, thereby preventing power from being wastefully consumed at the substracter 309.

Cycle 1 and cycle 2 are not limited to one clock cycle. However, the state of cycle 1 and the state of cycle 2 may change every several clocks. Three or more computation processes may be allocated to one computing unit.

The input fixation units 314 and 315 may be implemented, for example, with latch circuits. In this latch circuit, when an enable signal from the controller 313, as a control signal, is in a "high" state (high level), an input from the multiplier 307 is output without change, and when an enable sign is in a "low" state (low level), a value of an output from latch circuit does not change even if any value is input from the multiplier 307.

Therefore, control signals to the input fixation units 314 and 315 from the controller 313 are connected to enable signals from the latch circuits. Thus, the latch circuits can be used as the input fixation units 314 and 315.

Figure 8:
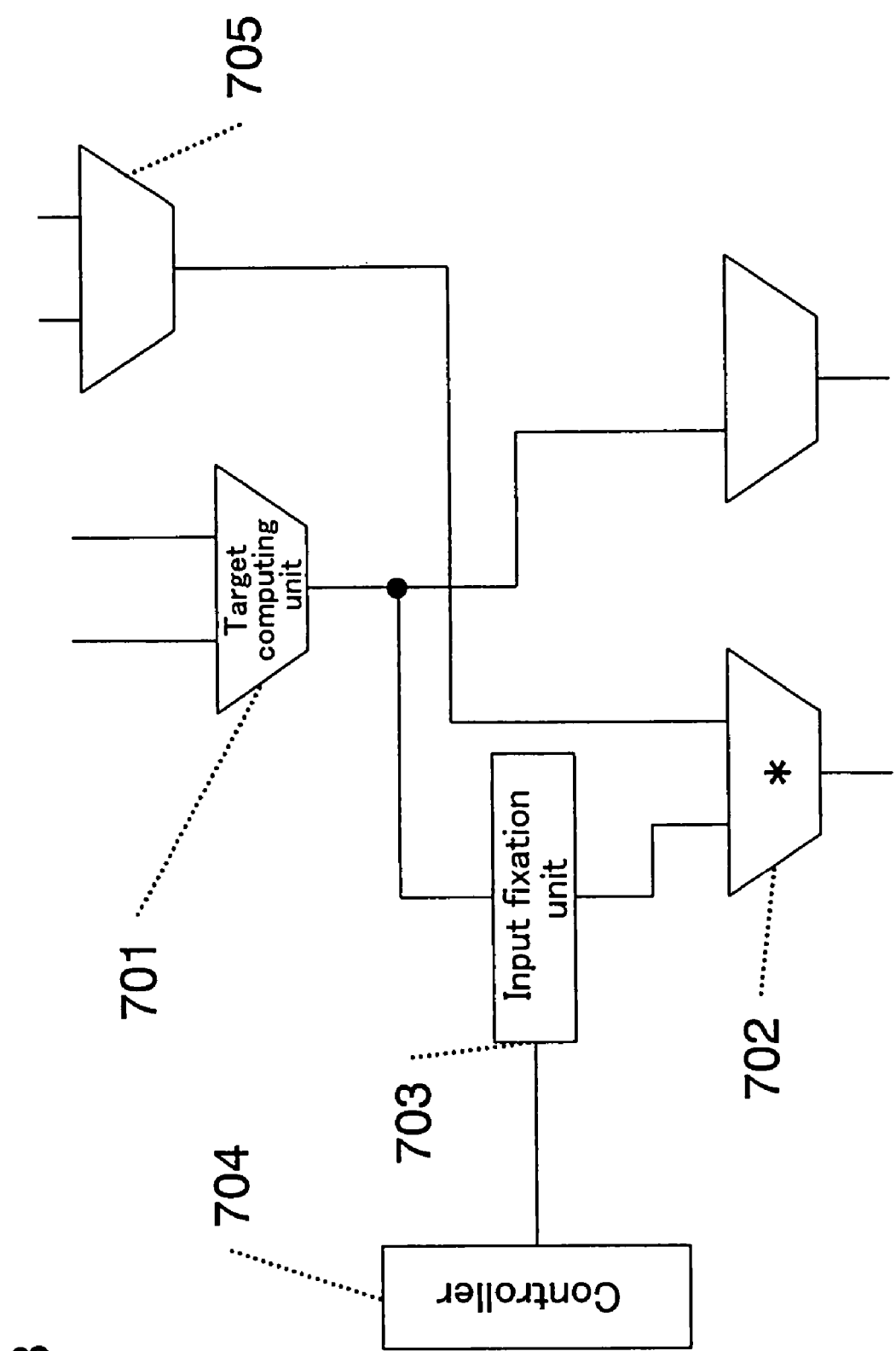
FIG. 8 is a diagram showing an exemplary circuit having an input fixation unit inserted when a subsequent computing unit is a multiplier.
Figure 9:
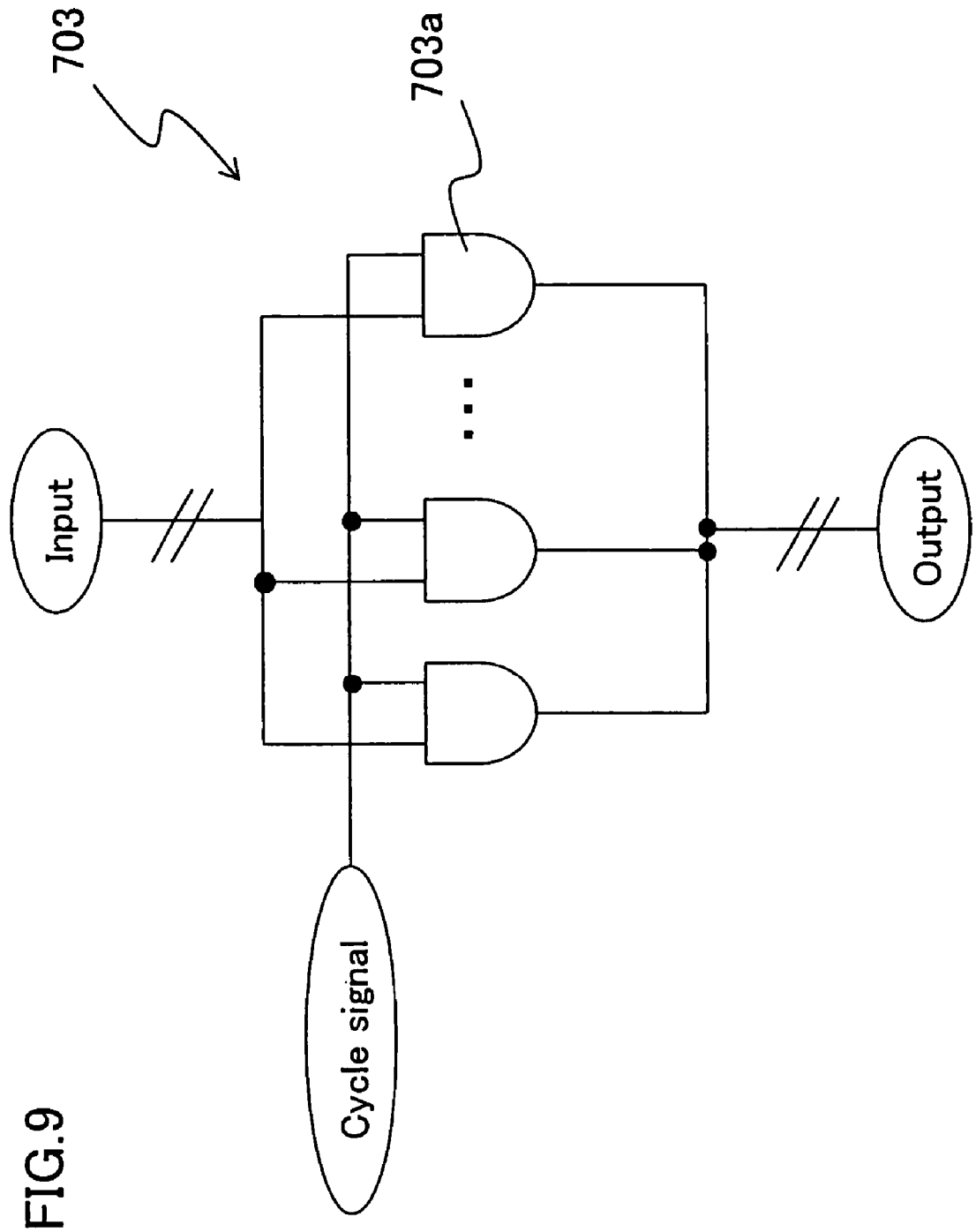
FIG. 9 is a diagram showing an example of an input fixation unit using AND gates.

In addition, as shown in FIG. 8, when a computing unit 702 subsequent to a target computing unit 701, which is allocated in order to execute a plurality of computation processes in the allocation step (step S3), is a multiplier, a circuit including a plurality of AND gates 703a as shown in FIG. 9 may be used as the input fixation unit 703. The plurality of AND gates 703a is controlled by a cycle signal from a controller 704 as a control signal.

In the case of the input fixation unit 703 shown in FIG. 9, a logical product of a cycle signal from the controller 704 as a control signal and an input from the target computing unit 701 is output from the plurality of AND gates 703a. In this input fixation unit 703, when a cycle signal is in a "high state" (high level), an input from the target computing unit 701 is input to the subsequent multiplier 702 without change, and when a cycle signal is in a "low" state (low level), an output to the subsequent multiplier 702 is fixed by outputting "0" bits. Accordingly, when the multiplier 702 is inactive, a signal inside the subsequent multiplier 702 always has "0", which does not cause switching nor consume power.

As one advantage of the structure having the plurality of AND gates 703a, a circuit size of the AND gate 703a is smaller than that of a latch circuit.

Further, in the case when the multiplier 702 is inactive, there is an advantage of not requiring an input fixation unit between the computing unit 705 and the subsequent multiplier 702 even if an output from a computing unit 705 which is connected to another input is changed. The reason for this is because the input fixation unit 703 always outputs "0" when the subsequent multiplier 702 is inactive. Thus, even if an output from the computing unit 705 is changed, a signal inside the subsequent multiplier 702 does not change, and thus does not consume power. Accordingly, it is sufficient in this case if the input fixation unit 703 is provided at one of the outputs of the input fixation unit 703 to the subsequent multiplier 702.

FIG. 8 shows merely an example that the computing unit 702 is a multiplier. Thus, like a bit AND computing unit, for example, as long as an output of a computing unit always has "0" when one of the inputs of the computing unit has "0", then a similar effect can be obtained.

Further, when the subsequent computing unit 702 is an adder or a subtracter, an output of the subsequent computing unit 702 change even if one of the inputs of the subsequent computing unit 702 has "0", thereby consuming power. However, since a carry does not propagate, the number of switchings is reduced, and thus an effect of reducing power consumption is obtained.

When an AND gate is used as the input fixation unit 703, power is not consumed when a cycle signal from the controller 704 is in a "low" state (low level). However, when the state of a cycle signal changes from a "high" state (high level) to a "low" state (low level), an output from the input fixation unit 703 is changed to "0", which results in causing a switching and power consumption. Therefore, it is advantageous to use a latch circuit as the input fixation unit 703 when states are frequently switched between active and inactive, in view of the power consumption.

Figure 10:
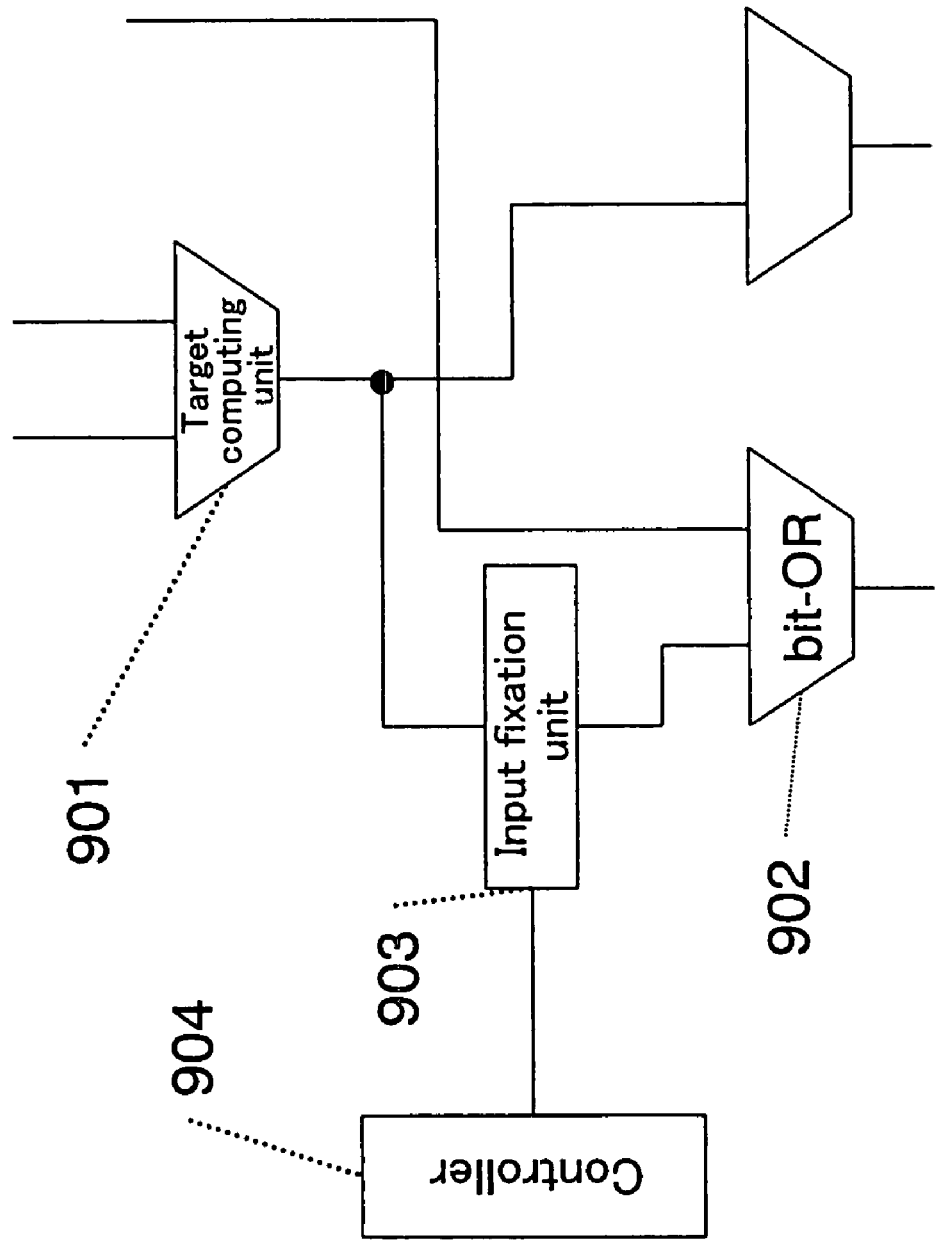
FIG. 10 is a diagram showing an exemplary circuit having an input fixation unit inserted when a subsequent computing unit is a bit OR circuit.
Figure 11:
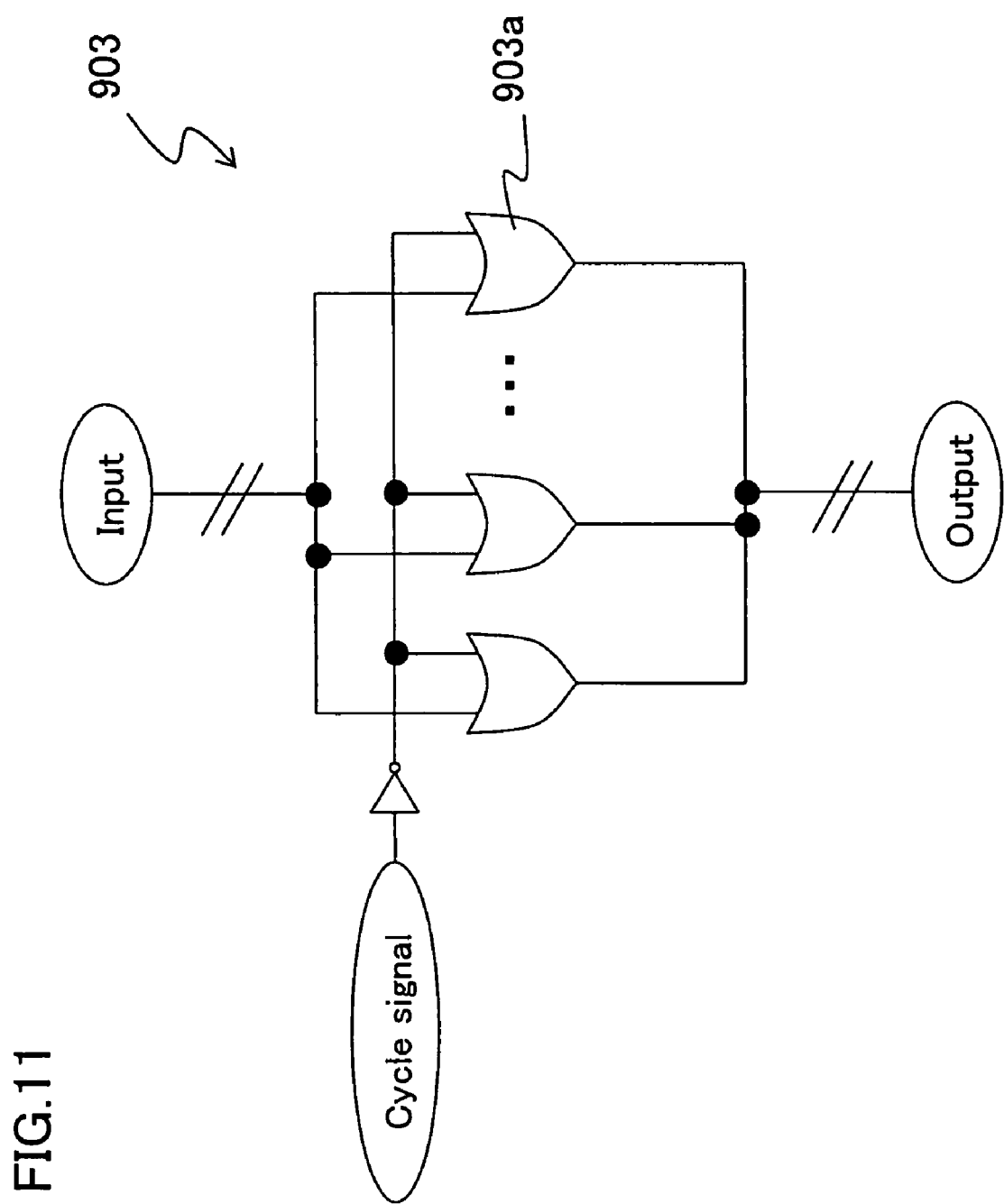
FIG. 11 is a diagram showing an example of an input fixation unit using OR gates.

In addition, as shown in FIG. 10, when a computing unit 902 subsequent to a target computing unit 901, which is allocated in order to execute a plurality of computation processes in the allocation step (step S3), is a bit OR computing unit, a circuit including a plurality of OR gates 903a as shown in FIG. 11 may be used as the input fixation unit 903.

In the case of the input fixation unit 903 shown in FIG. 11, a logical sum of a cycle signal from a controller 904 and an output from the computing unit 901 is output. In this input fixation unit 903, when a cycle signal is in a "high state" (high level), an output from the computing unit 901 is input, without change, to the bit OR computing unit 902, and when a cycle signal is in a "low" state (low level), an input to a bit OR computing unit, which is the subsequent computing unit 902, is fixed by outputting "1" bits. Accordingly, when the bit OR computing unit, which is the subsequent computing unit 902, is inactive, a signal inside the bit OR computing unit, which is the subsequent multiplier 902, always has "1", which does not cause switching nor consume power.

FIG. 10 shows merely an example that the subsequent computing unit 902 is a bit OR computing unit. Thus, as long as a computing unit always outputs only "1" bits when one of the inputs of the computing unit has only "1" bits, then a similar effect can be obtained.

As described above, an input fixation unit is inserted between (i) a computing unit targeted for executing a plurality of computation processes by shifting a timing of the plurality of computation processes which are different from each other and (ii) a subsequent computing unit, thereby reducing power wastefully to be consumed at the subsequent computing unit and computing units subsequent to the subsequent computing units.

Figure 14:
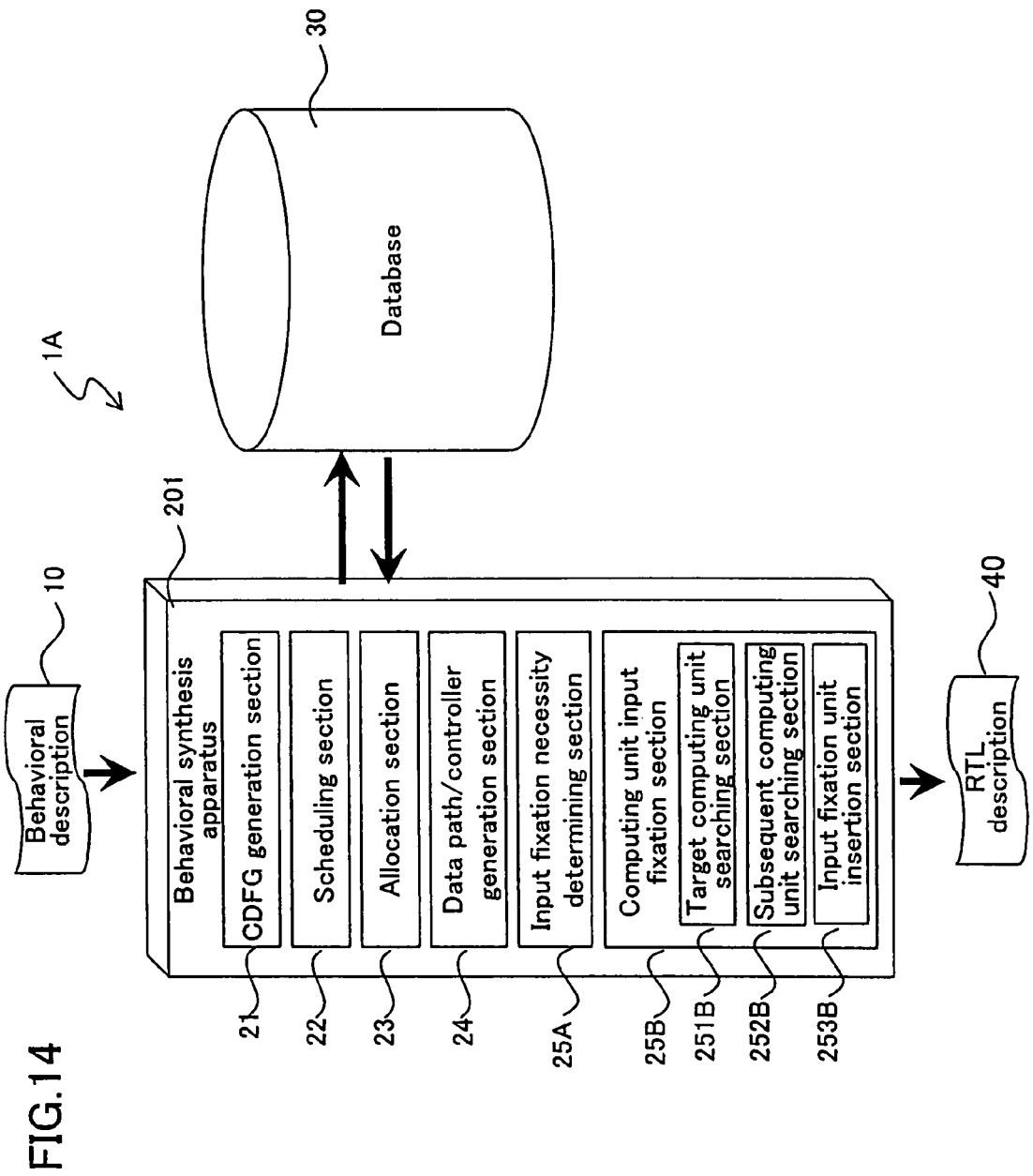
FIG. 14 is a block diagram showing an essential exemplary structure of a computer system according to another embodiment of the present invention.
Figure 15:
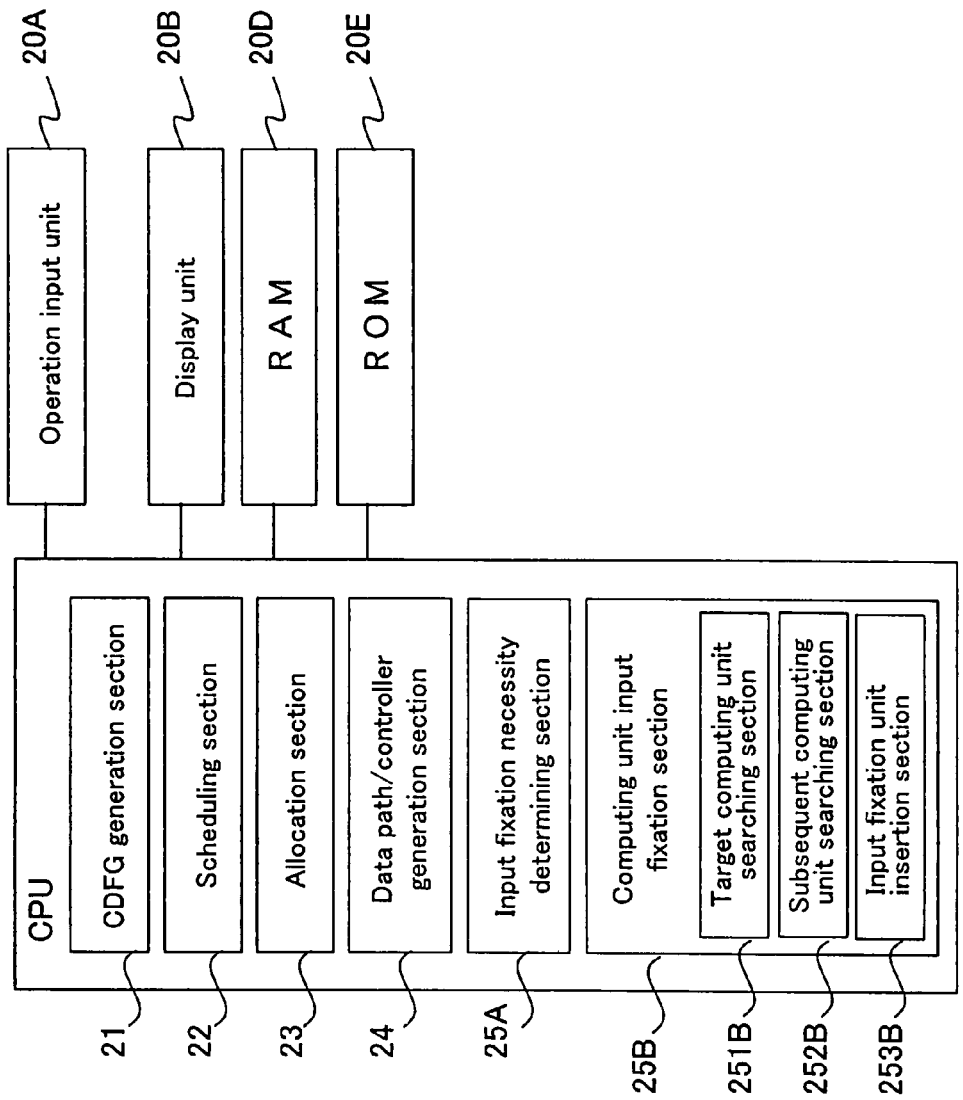
FIG. 15 is a block diagram showing a hardware structure of a behavioral synthesis apparatus shown in FIG. 14.
Figure 16:
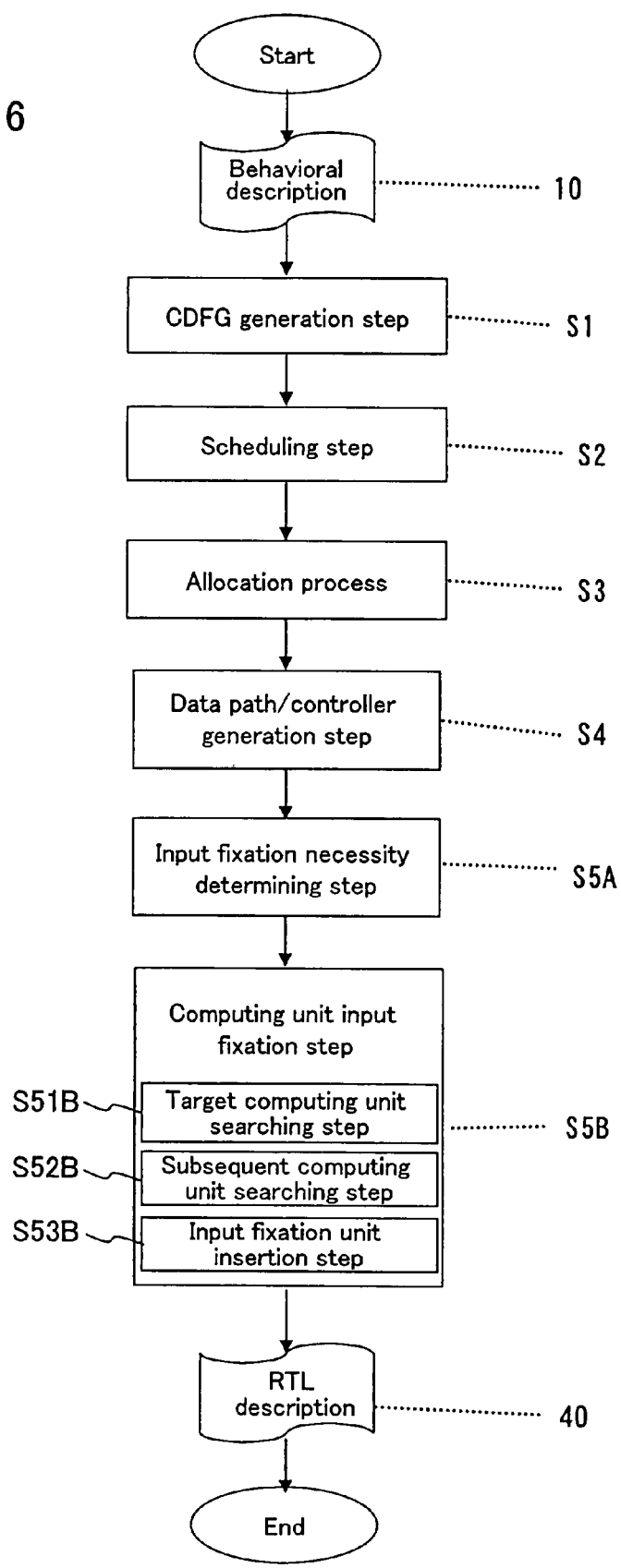
FIG. 16 is a flowchart showing a procedure of a behavioral synthesis process by the behavioral synthesis apparatus shown in FIG. 14.

However, given the fact that power to be consumed increases due to the insertion of an input fixation unit itself, an input fixation necessity determining step may be added prior to the computing unit input fixation step shown in FIG. 3 in order to make it possible to select whether or not the computing unit input fixation step should be performed. FIG. 14 shows an essential exemplary structure of a computer system 1A according to another embodiment in this case. FIG. 15 shows a hardware structure of a behavioral synthesis apparatus 201 of the computer system 1A. FIG. 16 shows a procedure of a behavioral synthesis process by the behavioral synthesis apparatus 201.

In other words, at a stage prior to a computing unit input fixation section 25B (computing unit input fixation step S5B), it is possible to provide an input fixation necessity determining section 25A (input fixation necessity determining section S5A) for comparing a value of estimated power consumption when an input fixation unit is inserted between computing units and a value of estimated power consumption when no input fixation unit is inserted between the computing units and for initiating the computing unit fixation section 25B at the next stage and inserting the input fixation unit between the computing units only when the former is smaller than the latter.

Also in this case, the computing unit input fixation section 25B (computing unit input fixation step S5B) includes: target computing unit searching section 251B (target computing unit searching step S51B) for making reference to the result processed by the allocation section 23 and searching a target computing unit allocated by the allocation section 23; subsequent computing unit searching section 252B (subsequent computing unit searching step S52B) for searching a subsequent computing unit, to which an output from the target computing unit is input; and input fixation unit insertion section 253B (input fixation unit insertion section S53B) for inserting an input fixation unit between the target computing unit and the subsequent computing unit.

Figure 12:
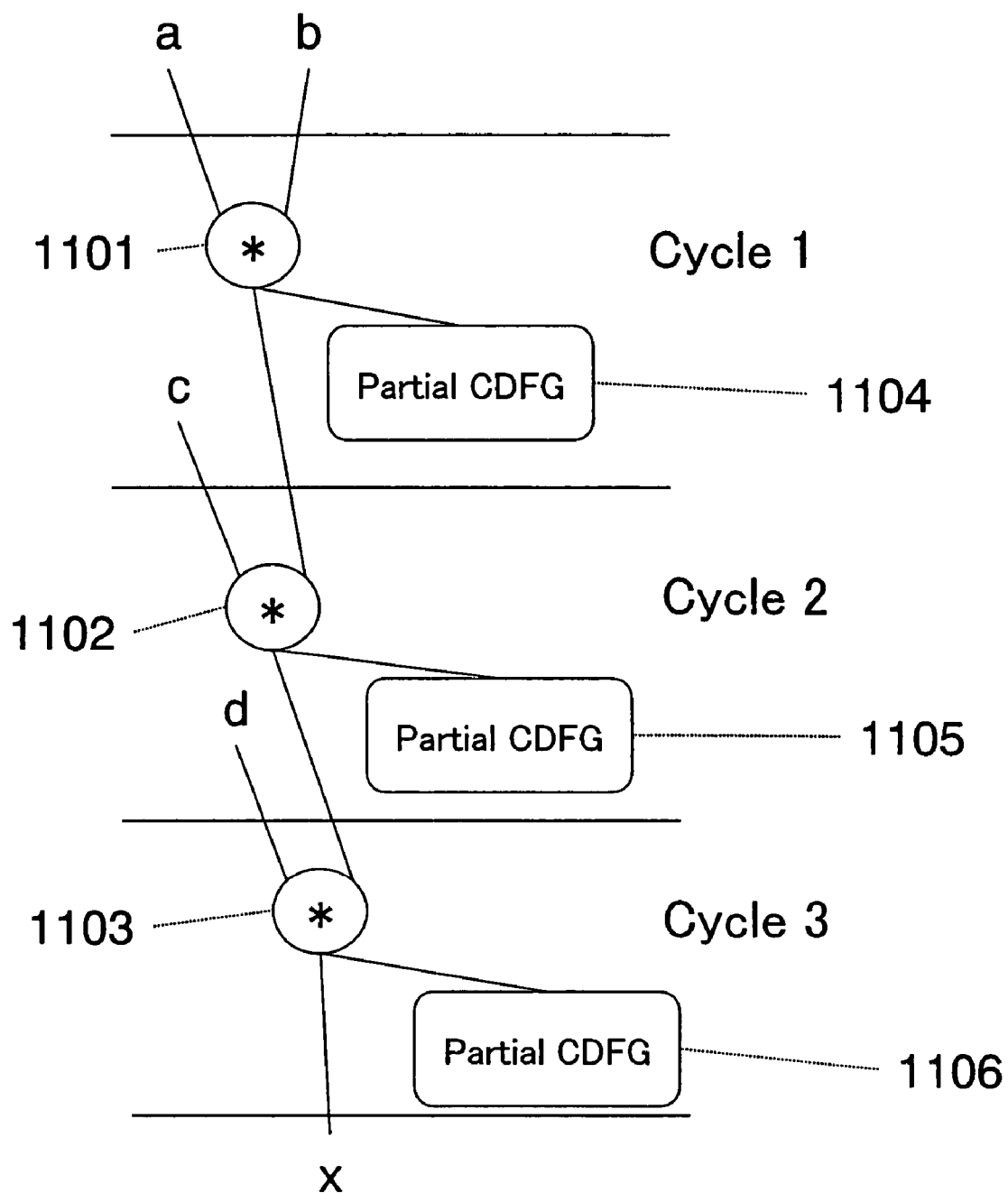
FIG. 12 shows an example of a CDFG having three multiplication processes therein.

FIG. 12 shows an example of a CDFG having three multiplication processes therein.

In the example shown in FIG. 12, three multiplication processes (multipliers 1101, 1102 and 1103) are scheduled at different cycles (cycles 1 to 3), respectively, in the scheduling step. In the next allocation step, these three multiplication processes are allocated so as to be executed by one multiplier. In FIG. 12, reference numeral 1104 represents a part of the CDFG, to which an output of the multiplier 1101 is transmitted, reference numeral 1105 represents a part of the CDFG, to which an output of the multiplier 1102 is transmitted, and reference numeral 1106 represents a part of the CDFG, to which an output of the multiplier 1103 is transmitted.

The partial CDFGs 1104, 1105 and 1106 follow the CDFG downward from the multipliers 1101, 1102 and 1103, and the partial CDFGs 1104, 1105 and 1106 are partial CDFG until a cycle is changed or before a shared computation process is reached. The reason for setting such partial CDFGs is because a result processed at a computing unit is not transmitted to its subsequent computing units since data is temporarily stored in a register when a cycle is changed, and a result of the shared computation process is not transmitted to its subsequent computing units by inserting an input fixation unit.

Figure 13:
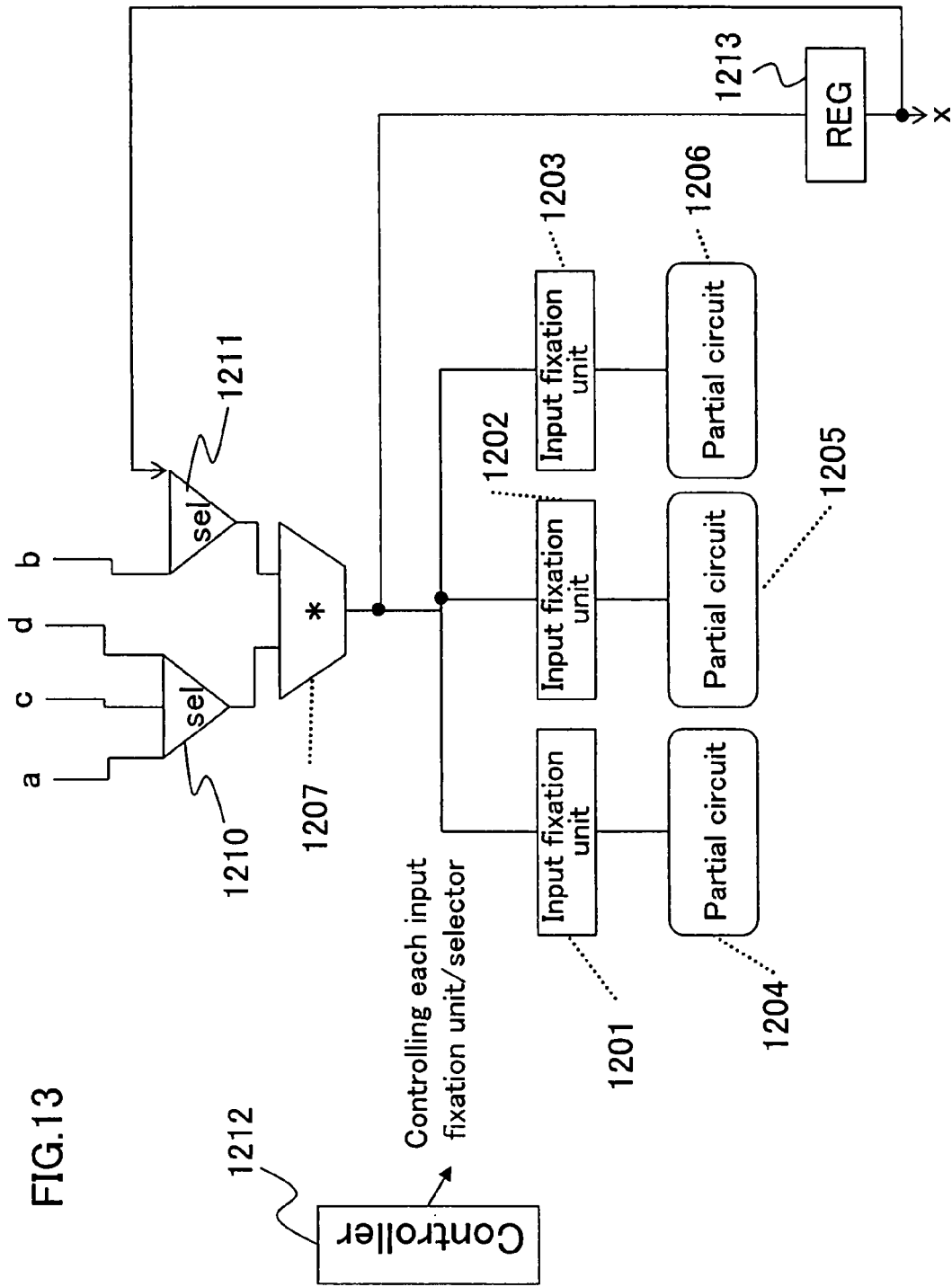
FIG. 13 is a diagram showing an exemplary circuit for executing the CDFG shown in FIG. 12.

FIG. 13 is a diagram showing a data path and controller for executing the partial CDFGs in FIG. 12.

In FIG. 13, an output from a multiplier 1207 is input to partial circuits 1204, 1205 and 1206 for executing the partial CDFGs 1104, 1105 and 1106, respectively, via input fixation units 1201, 1202 and 1203. The input fixation units 1201, 1202 and 1203 and selectors 1210 and 1211 for selecting an input to the multiplier 1207 are controlled by a control signal from a controller 1212. An output terminal of an REG 1213 connected to an output from the multiplier 1207 is connected to the other input terminal of the selector 1211.

Herein, it is assumed that average power consumptions of the input fixation units 1201, 1202 and 1203 are denoted as Pa1, Pa2 and Pa3, respectively; average power consumptions of the partial circuits 1204, 1205 and 1206 for executing the partial CDFGs are denoted as Pg1, Pg2 and Pg3, respectively; and a ratio of the number of times each cycle 1, 2 and 3 is executed is denoted as N1: N2: N3, respectively. Power consumed in a circuit correlates with the number of transistors included in the circuit. Accordingly, the number of transistors and a size of the circuit may be used as values of the power consumptions Pa1, Pa2, Pa3, Pg1, Pg2 and Pg3. The ratio of N1, N2 and N3 of the number of the executions among cycles 1, 2 and 3 is 1:1:1 in FIG. 12. However, in the case when some cycle is present in a conditional branching or in a loop, the number of executions significantly differs from one another. Therefore, the ratios of this number of executions accordingly are used.

A total power consumed at the partial circuit 1204 and the input fixation unit 1201 of the partial circuit 1204 in FIG. 13 is:

$$N1 \times (Pa1 + Pg1)$$

since an output from the multiplier 1207 changes only during cycle 1.

A total power consumed when the input fixation unit 1201 is not used is:

$$(N1 + N2 + N3) \times Pg1$$

since an output from the multiplier 1207 changes during cycles 1, 2 and 3.

Accordingly, in the input fixation necessity determining step S5A shown in FIG. 16, when $$N1 \times (Pa1 + Pg1) < Pg1 \times (N1 + N2 + N3)$$

is established, it is determined that an input fixation unit be inserted in the computing unit input fixation step S5B at the next stage. In other words, in the input fixation necessity determining step S5A which is provided at a stage prior to the computing unit input fixation step S5B, a comparison is performed between a value of estimated power consumption when an input fixation unit is inserted between computing units and a value of estimated power consumption when no input fixation unit is inserted between the computing units, as described above. Only when the former value is smaller than the latter value, the computing unit fixation step S5B (computing unit input fixation section 25B) is initiated and controlled so as to insert an input fixation unit, thereby preventing power consumption from unintendedly increasing due to the insertion of the input fixation unit.

The determination formula shown above is merely an example. A term in view of static power consumption resulting from leak current of an input fixation unit may be added. In addition, a term in view of an increase of a size of an input fixation unit may be added.

As described above, according to the present embodiment, in a behavioral synthesis apparatus 20 for generating a register transfer level (RTL) description from a behavior description, an output of a computing unit is input to a plurality of its subsequent computing units, and in the case when a valid cycle in which a result computed at each subsequent computing unit is valid is different from each other, a computation unit input fixation section 25 is provided between the computing unit and at least one of its subsequent computing units in order to an input fixation unit for fixing an input of the subsequent computing units during cycles other than a cycle when a result computed at the subsequent computing unit is valid. Accordingly, the behavioral synthesis process can obtain an effect of the present invention that wasteful power consumption caused due to the sharing of one computing unit is prevented, thereby realizing low power consumption of hardware.

A specific description has not been given in the embodiments described above, a behavioral synthesis method using a computer system 1 including a behavioral synthesis apparatus 20 according to the present invention is used for automatically designing a digital circuit. A mask for forming each layer for a semiconductor apparatus is automatically designed based on the automatically designed digital circuit. Each mask is used for manufacturing an actual digital circuit. The actual digital circuit including a logical circuit manufactured in this manner can obtain an effect of the present invention that wasteful power consumption caused due to the sharing of one computing unit is prevented, thereby realizing low power consumption of hardware.

In addition, no specific description has not been given in the embodiments described above. However, in a behavioral synthesis apparatus 20 or 201 for performing a computer-automated synthesis of a circuit description 10 of a register transfer level from a behavioral description describing a process operation of a circuit, an output of a target computing unit is input to a plurality of subsequent computing units, and in the case when a valid cycle in which a result computed at each of the plurality of subsequent computing units is valid is different from each other, the behavioral synthesis apparatus only includes a computing unit fixation section 25 or 25B for inserting an input fixation unit between the target computing unit and at least one of the plurality of subsequent computing units, the input fixation unit fixing an input value to "0", "1" or the like to the at least one subsequent computing unit during cycles other than the valid cycle in which a result computed at the at least one subsequent computing unit is valid, thereby achieving the objective of the present invention of preventing an occurrence of wasteful power consumption caused due to the sharing of one computation unit in a behavioral synthesis process in order to easily and assuringly achieve lower power consumption of hardware.

Conventionally, when there is the same computation on paths which do not simultaneously operate, it is possible to reduce a chip area (circuit size) by sharing one computing unit among the paths. The behavioral synthesis process analyzes a data flow graph to automatically perform a sharing. However, there is a problem as described above that since an output of a shared computing unit fans out, an input on a non-active path changes along with the change of a signal on an active path, thus causing an unnecessary switching and wastefully consuming power on the non-active path.

In order to solve this problem, when a computing unit is shared in a behavioral synthesis process, the present invention inserts an input fixation unit on an output side of the shared computing unit. This input fixation unit passes data when a path belonging to the input fixation unit is active and outputs a fixed value (fixing an input) when the path belonging to the input fixation unit is inactive. In a timing of not using a subsequent computing unit, an input value to the subsequent computing unit from the shared computing unit is fixed to a constant value, thereby eliminating a wasteful switching to reduce power consumption. In addition, at the time of inserting the input fixation unit, considering an increase of power consumption due to the insertion of the input fixation unit itself, the input fixation unit is introduced at a predetermined position of a stage prior to the input fixation unit only when an effect of reducing power consumption is recognized owing to the insertion of the input fixation unit (only when an effect of reducing power consumption is detected). In this manner, the present invention can be used for designing a system LSI based on C language.

As described above, the present invention is exemplified by the use of its preferred embodiments. However, the present invention should not be interpreted solely based on the embodiments described above. It is understood that the scope of the present invention should be interpreted solely based on the claims. It is also understood that those skilled in the art can implement equivalent scope of technology, based on the description of the present invention and common knowledge from the description of the detailed preferred embodiments of the present invention. Furthermore, it is understood that any patent, any patent application and any references cited in the present specification should be incorporated by reference in the present specification in the same manner as the contents are specifically described therein.

INDUSTRIAL APPLICABILITY

In the field of: a behavioral synthesis apparatus of a computer system for performing a computer-automated synthesis of a circuit description of a register transfer level (RTL) from a behavioral description (design specification of a circuit) having a circuit behavior described therein in order to support designing and manufacturing of a digital circuit; a behavioral synthesis method using the behavioral synthesis apparatus; a method for manufacturing the digital circuit using the behavioral synthesis apparatus; a behavioral synthesis control program for performing the behavioral synthesis method; and a computer-readable recording medium having the behavioral synthesis control program recorded thereon, in the case of generating a circuit in which one computing unit is shared by a plurality of computation processes, by inserting an input fixation unit, for fixing input to its subsequent computing unit when the subsequent computing unit is inactive, between the computing unit and the subsequent computing unit, it is possible to suppress wasteful power consumption by the subsequent computing unit prevented, thereby realizing low power consumption of hardware.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A behavioral synthesis apparatus for performing a computer-automated synthesis of a circuit description of a register transfer level from a behavioral description describing a process operation of a circuit, comprising:

a computing unit fixation section for inserting an input fixation unit between a target computing unit and at least one of a plurality of subsequent computing units, wherein the input fixation unit inputting an output of a target computing unit to a plurality of subsequent computing units during an active cycle of the plurality of subsequent computing units in which a result computed at each of the plurality of subsequent computing units is valid and is different from each other, the input fixation unit fixing an input to the at least one subsequent computing unit at a logical level during cycles other than the active cycle of the plurality of subsequent computing units in which a result computed at the at least one subsequent computing unit is valid.

2. A behavioral synthesis apparatus according to claim 1, further comprising:
   control data flow graph generation section for automatically generating a control data flow graph from the behavior description, the control data flow graph representing a flow of data as a branch and each computation process or communication process as a node in a graph;
   scheduling section for determining during which execution cycle a process at each node in the control data flow graph should be executed;
   allocation section for allocating the computation process to a circuit element of a computing unit and at the same time allocating data being currently processed to a register for storage; and
   data path/controller generation section for automatically generating a data path and a controller for controlling the data path in accordance with each result processed by the scheduling section and the allocation section, and for creating a net list representing a connection relationship among the data path, the controller, the computing unit and the register, and
   the computing unit input fixation section inserts the input fixation unit between the target computing unit allocated with a plurality of computation processes by the allocation section and a subsequent computing unit at an output of the target computing unit in the net list obtained by the data path/controller generation section.

3. A behavioral synthesis apparatus according to claim 2, the computing unit input fixation section includes:
   target computing unit searching section for making reference to the result processed by the allocation section and searching the target computing unit allocated by the allocation section;
   subsequent computing unit searching section for searching a subsequent computing unit, to which an output from the target computing unit is input; and
   input fixation unit insertion section for inserting the input fixation unit between the target computing unit and the subsequent computing unit.

4. A behavioral synthesis apparatus according to claim 2, wherein in the input fixation unit, in accordance with a control signal from the controller, an output from the target computing unit is input, without change, to the subsequent computing unit during a valid cycle when the subsequent computing unit is active, and
   an input to the subsequent computing unit is fixed to a constant value during cycles other than the valid cycle regardless of a state of the output from the target computing unit.

5. A behavioral synthesis apparatus according to claim 1, wherein the input fixation unit is a latch circuit.

6. A behavioral synthesis apparatus according to claim 1, wherein the input fixation unit includes a plurality of AND gates controlled by a control signal from a controller.

7. A behavioral synthesis apparatus according to claim 1, wherein the subsequent computing unit is a multiplier, an adder or a subtracter.

8. A behavioral synthesis apparatus according to claim 1, wherein the input fixation unit outputs an input without change during the valid cycle and outputs bits only having "0" during cycles other than the valid cycle.

9. A behavioral synthesis apparatus according to claim 1, wherein the subsequent computing unit outputs bits only having "0" when all the bits being "0" are input to one of inputs of the subsequent computing unit.

10. A behavioral synthesis apparatus according to claim 1, wherein the subsequent computing unit is a bit OR computing unit, the input fixation unit includes a plurality of OR gates controlled by a control signal from a controller.

11. A behavioral synthesis apparatus according to claim 1, wherein the input fixation unit outputs an input without change during the valid cycle and outputs bits only having "1" during cycles other than the valid cycle.

12. A behavioral synthesis apparatus according to claim 10, wherein the input fixation unit outputs an input without change during the valid cycle and outputs bits only having "1" during cycles other than the valid cycle.

13. A behavioral synthesis apparatus according to claim 1, wherein the subsequent computing unit outputs bits only having "1" when all the bits being "1" are input to one of inputs of the subsequent computing unit.

14. A behavioral synthesis apparatus according to claim 10, wherein the subsequent computing unit outputs bits only having "1" when all the bits being "1" are input to one of inputs of the subsequent computing unit.

15. A behavioral synthesis apparatus according to claim 1, further comprising an input fixation necessity determining section for comparing a value of estimated power consumption when the input fixation unit is inserted between the computing units and a value of estimated power consumption when no input fixation unit is inserted between the computing units and for initiating the computing unit fixation section and inserting the input fixation unit between the computing units only when the former is smaller than the latter.

16. A behavioral synthesis apparatus according to claim 2, further comprising an input fixation necessity determining section for comparing a value of estimated power consumption when the input fixation unit is inserted between the computing units and a value of estimated power consumption when no input fixation unit is inserted between the computing units and for initiating the computing unit fixation section and inserting the input fixation unit between the computing units only when the former is smaller than the latter.

17. A behavioral synthesis method using a behavioral synthesis apparatus for performing a computer-automated synthesis of a circuit description of a register transfer level from a behavioral description describing a process operation of a circuit, the behavioral synthesis method comprising:
   inserting using a processor, an input fixation unit between a target computing unit and at least one of a plurality of subsequent computing units,
   inputting an output of the target computing unit to the plurality of subsequent computing units during an active cycle of the plurality of subsequent computing units in which a result computed at each of the plurality of subsequent units is valid and is different from each other, and
   the input fixation unit fixing an input to the at least one subsequent computing unit at a logical level during cycles other than the active cycle of the plurality of subsequent computing units in which a result computed at the at least one subsequent computing unit is valid.

18. A behavioral synthesis method according to claim 17, further comprising:
   automatically generating a control data flow graph from the behavior description, the control data flow graph representing a flow of data as a branch and each computation process or communication process as a node in a graph;

determining during which execution cycle a process at each node in the control data flow graph should be executed;

allocating the computation process to a circuit element of a computing unit and at the same time allocating data being currently processed to a register for storage; and automatically generating a data path and a controller for controlling the data path in accordance with each result processed by the determining step and the allocating step, and for creating a net list representing a connection relationship among the data path, the controller, the computing unit and the register, and inserting the input fixation unit between the target computing unit and a subsequent computing unit at an output of the target computing unit in the created net list.

19. A behavioral synthesis method according to claim 18, wherein the inserting step includes:

making reference to the result processed by the allocation step and searching the target computing unit allocated by the allocation step;

searching a subsequent computing unit, to which an output from the target computing unit is input; and inserting the input fixation unit between the target computing unit and the subsequent computing unit.

20. A behavioral synthesis method according to claim 17, further comprising comparing a value of estimated power consumption when the input fixation unit is inserted between the computing units and a value of estimated power consumption when no input fixation unit is inserted between the computing units and initiating the inserting step and inserting the input fixation unit between the computing units only when the former is smaller than the latter.

21. A behavioral synthesis method according to claim 18, further comprising comparing a value of estimated power consumption when the input fixation unit is inserted between the computing units and a value of estimated power consumption when no input fixation unit is inserted between the computing units and initiating the inserting step and inserting the input fixation unit between the computing units only when the former is smaller than the latter.

22. A behavioral synthesis method according to claim 17, wherein in the input fixation unit, in accordance with a control signal from a controller, an output from the target computing unit is input, without change, to the subsequent computing unit during a valid cycle when the subsequent computing unit is active, and an input to the subsequent computing unit is fixed to a constant value during cycles other than the valid cycle regardless of a state of the output from the target computing unit.

23. A digital circuit manufacturing method, using a behavioral synthesis method according to claim 17 for designing a digital circuit, for manufacturing the designed digital circuit.

24. A computer-readable recording medium having a behavioral synthesis control program according to claim 17 recorded thereon.

* * * * *